US010872668B2

(12) United States Patent
Shimizu et al.

(10) Patent No.: US 10,872,668 B2
(45) Date of Patent: *Dec. 22, 2020

(54) SEMICONDUCTOR STORAGE DEVICE

(71) Applicant: Toshiba Memory Corporation, Tokyo (JP)

(72) Inventors: Mai Shimizu, Kanagawa (JP); Koji Kato, Kanagawa (JP); Yoshihiko Kamata, Kanagawa (JP); Mario Sako, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/283,239

(22) Filed: Feb. 22, 2019

(65) Prior Publication Data
US 2019/0189213 A1 Jun. 20, 2019

Related U.S. Application Data

(63) Continuation of application No. 15/695,470, filed on Sep. 5, 2017, now Pat. No. 10,255,977.

(30) Foreign Application Priority Data

Mar. 22, 2017 (JP) .................. 2017-056335

(51) Int. Cl.
G11C 16/08 (2006.01)
G11C 16/30 (2006.01)
G11C 16/26 (2006.01)
G11C 16/04 (2006.01)
G11C 11/56 (2006.01)
(Continued)

(52) U.S. Cl.
CPC .......... G11C 16/08 (2013.01); G11C 11/5642 (2013.01); G11C 16/0483 (2013.01); G11C 16/24 (2013.01); G11C 16/26 (2013.01); G11C 16/30 (2013.01); G11C 16/32 (2013.01); G11C 16/3427 (2013.01)

(58) Field of Classification Search
CPC ..... G11C 16/08; G11C 16/0483; G11C 16/24; G11C 16/26; G11C 16/30; G11C 16/32; G11C 16/3427; G11C 11/5642
See application file for complete search history.

(56) References Cited

U.S. PATENT DOCUMENTS 6,307,783 B1  10/2001  Parker
7,715,231 B2   5/2010  Kim et al.
(Continued)

Primary Examiner — Jay W. Radke
(74) Attorney, Agent, or Firm — Kim & Stewart LLP

(57) ABSTRACT

A semiconductor storage device includes a first memory cell electrically connected to a first bit line and a first word line, a second memory cell electrically connected to a second bit line and the first word line, and a first circuit configured to supply voltages to the first word line. During a reading operation to read a page of memory cells including the first memory cell and the second memory cell, the first circuit supplies a first voltage to the first word line while the first memory cell is selected as a read target during a first time period, and supplies a second voltage greater than the first voltage to the first word line while the second memory cell is selected as a read target during a second time period that is different from the first time period, and directly thereafter, supplies the first voltage to the first word line.

16 Claims, 16 Drawing Sheets

(51) Int. Cl.
*G11C 16/24* (2006.01)
*G11C 16/32* (2006.01)
*G11C 16/34* (2006.01)

(56) References Cited

U.S. PATENT DOCUMENTS

| | | |
|---|---|---|
| 7,852,675 B2 | 12/2010 | Maejima |
| 8,233,323 B2 | 7/2012 | Hishida et al. |
| 8,372,720 B2 | 2/2013 | Fukuzumi et al. |
| 8,514,627 B2 | 8/2013 | Itagaki et al. |
| 8,952,426 B2 | 2/2015 | Maejima |
| 9,036,411 B2 | 5/2015 | Itagaki |
| 9,761,320 B1 * | 9/2017 | Chen ................... G11C 16/26 |
| 10,255,977 B2 * | 4/2019 | Shimizu .............. G11C 11/5642 |
| 2004/0170065 A1 * | 9/2004 | Kawai ................ G11C 16/0483 |
| | | 365/189.18 |
| 2007/0002627 A1 | 1/2007 | Youn |
| 2008/0209106 A1 | 8/2008 | Bennett et al. |
| 2009/0122606 A1 | 5/2009 | Kim et al. |
| 2011/0284946 A1 | 11/2011 | Kiyotoshi |
| 2014/0241057 A1 | 8/2014 | Funatsuki et al. |
| 2019/0006020 A1 * | 1/2019 | Sundaresan ............ G01R 31/50 |
| 2019/0392894 A1 * | 12/2019 | Zhao ................... G11C 11/5642 |

\* cited by examiner

SEMICONDUCTOR STORAGE DEVICE

CROSS-REFERENCE TO RELATED APPLICATION

This application is a continuation of U.S. patent application Ser. No. 15/695,470, filed on Sep. 5, 2017, which is based upon and claims the benefit of priority from Japanese Patent Application No. 2017-056335, filed Mar. 22, 2017, the entire contents of which are incorporated herein by reference.

FIELD

Embodiments described herein relate generally to a semiconductor storage device.

BACKGROUND

As semiconductor storage devices, there are known NAND flash memories.

DETAILED DESCRIPTION

Figure 1:
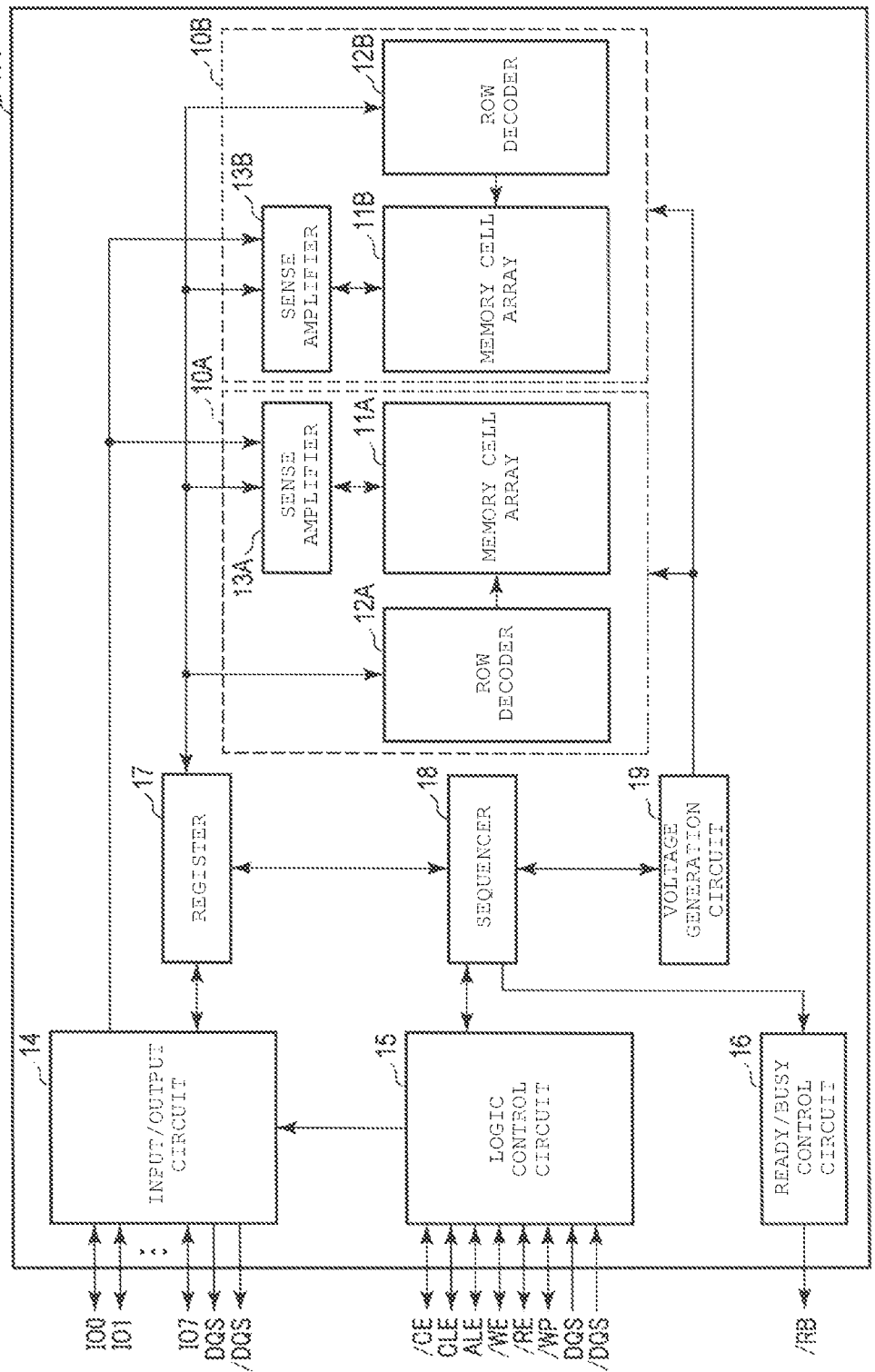
FIG. 1 is a diagram illustrating a semiconductor storage device according to a first embodiment.

In general, according to one embodiment, a semiconductor storage device includes a first memory cell electrically connected to a first bit line and a first word line, a second memory cell electrically connected to a second bit line and the first word line, and a first circuit configured to supply voltages to the first word line. During a reading operation to read a page of memory cells including the first memory cell and the second memory cell, the first circuit supplies a first voltage to the first word line while the first memory cell is selected as a read target during a first time period, and supplies a second voltage greater than the first voltage to the first word line while the second memory cell is selected as a read target during a second time period that is different from the first time period, and directly thereafter, supplies the first voltage to the first word line.

Embodiments will be described below with reference to the drawings. Throughout the drawings, the same reference numerals are given to the same components or portions.

First Embodiment

A semiconductor storage device according to a first embodiment will be described with reference to FIGS. 1 to 12. Hereinafter, a 3-dimensional stacked NAND flash memory in which memory cells are stacked 3-dimensionally on a semiconductor substrate will be described as an example of a semiconductor storage device. In the following description, the term "connection" includes not only a case of a direct connection between two components but also a case of connection between two components via an arbitrary, interposed element or elements. As used herein, a "first terminal of a transistor" indicates one of a source and a drain of a transistor and a "second terminal of the transistor" indicates the other of the source and the drain of the transistor. Also, a "control terminal of the transistor" refers to a gate of a transistor.

Configuration Example of First Embodiment

Hereinafter, an example configuration of the first embodiment will be described with reference to FIGS. 1 to 6.

As illustrated in FIG. 1, a semiconductor storage device 100 includes planes 10A and 10B, an input/output circuit 14, a logic control circuit 15, a ready/busy control circuit 16, a register 17, a sequencer 18, and a voltage generation circuit 19.

The input/output circuit 14 transmits and receives signals IO (IO0 to IO7) to and from the outside (a host or a memory controller) of the semiconductor storage device 100. The signals IO include commands, addresses, and data. The input/output circuit 14 transmits commands and addresses from the outside to the register 17. The input/output circuit 14 transmits write data from the outside to sense amplifiers 13 (13A and 13B) and transmits read data from the sense amplifiers 13 to the outside. The input/output circuit 14 transmits data strobe signals DQS and /DQS to the outside along with the read data. The read data is read in synchronization with the signals DQS and /DQS.

The logic control circuit 15 receives various control signals from the outside (from an external source) and controls the input/output circuit 14 and the sequencer 18. As control signals, a chip enable signal /CE, a command latch enable signal CLE, an address latch enable signal ALE, a write enable signal /WE, a read enable signal /RE, a write protect signal /WP, and the data strobe signals DQS and /DQS can be used. The signal /CE enables the semiconductor storage device 100, which is a semiconductor chip or the like. The signals CLE and ALE notifies the input/output circuit 14 that the signals IO are commands and addresses respectively. The signal /WE instructs the input/output circuit 14 to input the signals IO. The signal /RE instructs the input/output circuit 14 to output the signals IO. The signal /WP sets the semiconductor storage device 100 to a protection state, for example, when power is transitioning on and off. The signals DQS and /DQS are received along with the write data. The write data is written in synchronization with the signals DQS and /DQS.

The ready/busy control circuit 16 transmits the signal /RB to notify an outside controller or the like of the state of the semiconductor storage device 100. The signal /RB indicates whether the semiconductor storage device 100 is in a ready state (that is, a state in which a command can be received from the outside) or a busy state (that is, a state in which a command can not be received from the outside).

The register 17 retains commands and addresses supplied thereto. The register 17 transmits the addresses to the row decoders 12 (12A and 12B) and the sense amplifiers 13 (13A and 13B) and also transmits commands to the sequencer 18. The register 17 also retains various tables used for controlling the sequences performed according to the commands.

The sequencer 18 receives the commands and refers to the various tables retained in the register 17. Then, the sequencer controls the entire semiconductor storage device 100 according to information provided in the various tables.

The voltage generation circuit 19 includes various drivers. The voltage generation circuit 19 generates voltages necessary for operations such as writing, reading, and erasing data under the control of the sequencer 18. The voltage generation circuit 19 supplies generated voltages to the row decoders 12 and the sense amplifiers 13.

The plane 10A includes a memory cell array 11A, the row decoder 12A, and the sense amplifier 13A. The plane 10B has substantially the same configuration as plane 10A, and thus includes a memory cell array 11B, the row decoder 12B, and the sense amplifier 13B. In the following, the specific description of plane 10B will generally be omitted and only aspects of plane 10A will be described as representative of plane 10B as well.

The row decoder 12A receives a row address from the register 17 and selects a corresponding word line WL inside the memory cell array 11A based on the row address. Then, the row decoder 12A supplies a voltage from the voltage generation circuit 19 to the selected word line WL.

The sense amplifier 13A reads data stored in a memory cell via a bit line BL inside the memory cell array 11A and likewise writes data to a memory cell via a bit line BL by supplying a voltage from the voltage generation circuit 19 to the bit line BL. The sense amplifier 13A includes a data latch (not separately illustrated). The data latch temporarily stores the write data and read data. The sense amplifier 13A receives a column address from the register 17 and outputs data from the data latch to the input/output circuit 14 based on the column address.

Figure 2:
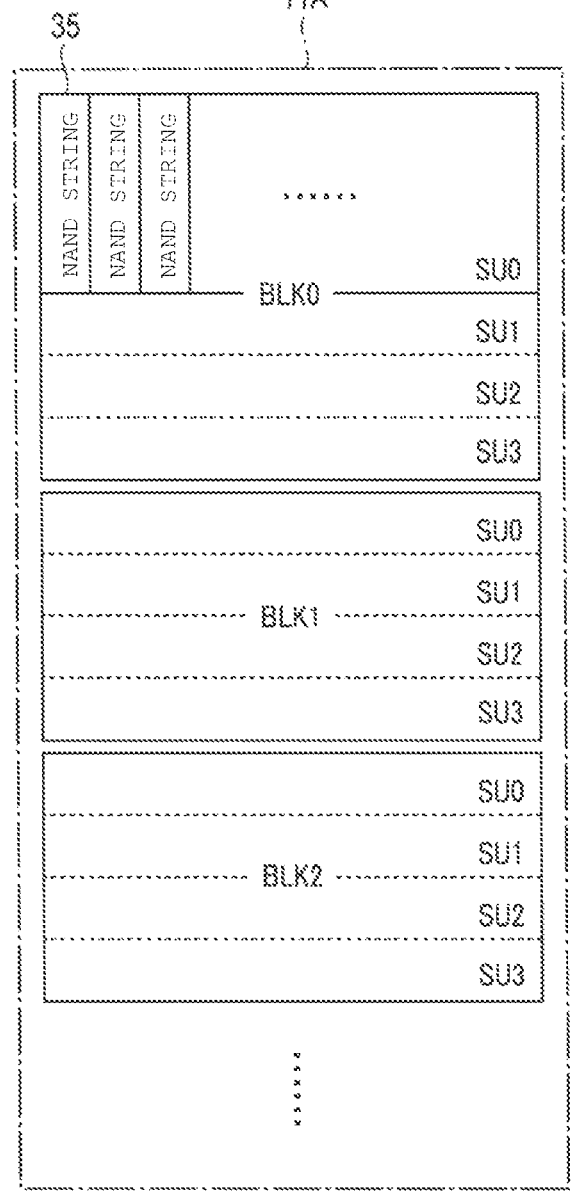
FIG. 2 is a diagram illustrating a memory cell array in the semiconductor storage device according to the first embodiment.

As illustrated in FIG. 2, the memory cell array 11A includes a plurality of blocks BLK (BLK0, BLK1, BLK2 . . . ) including nonvolatile memory cell transistors (which may also be referred to in some instances as memory cells) associated with rows and columns. The block BLK includes, for example, four string units SU (SU0 to SU3). Each string unit SU includes a plurality of NAND strings 35. Any number of blocks could be provided in the memory cell array 11A and likewise any number of string units could be provided.

Figure 3:
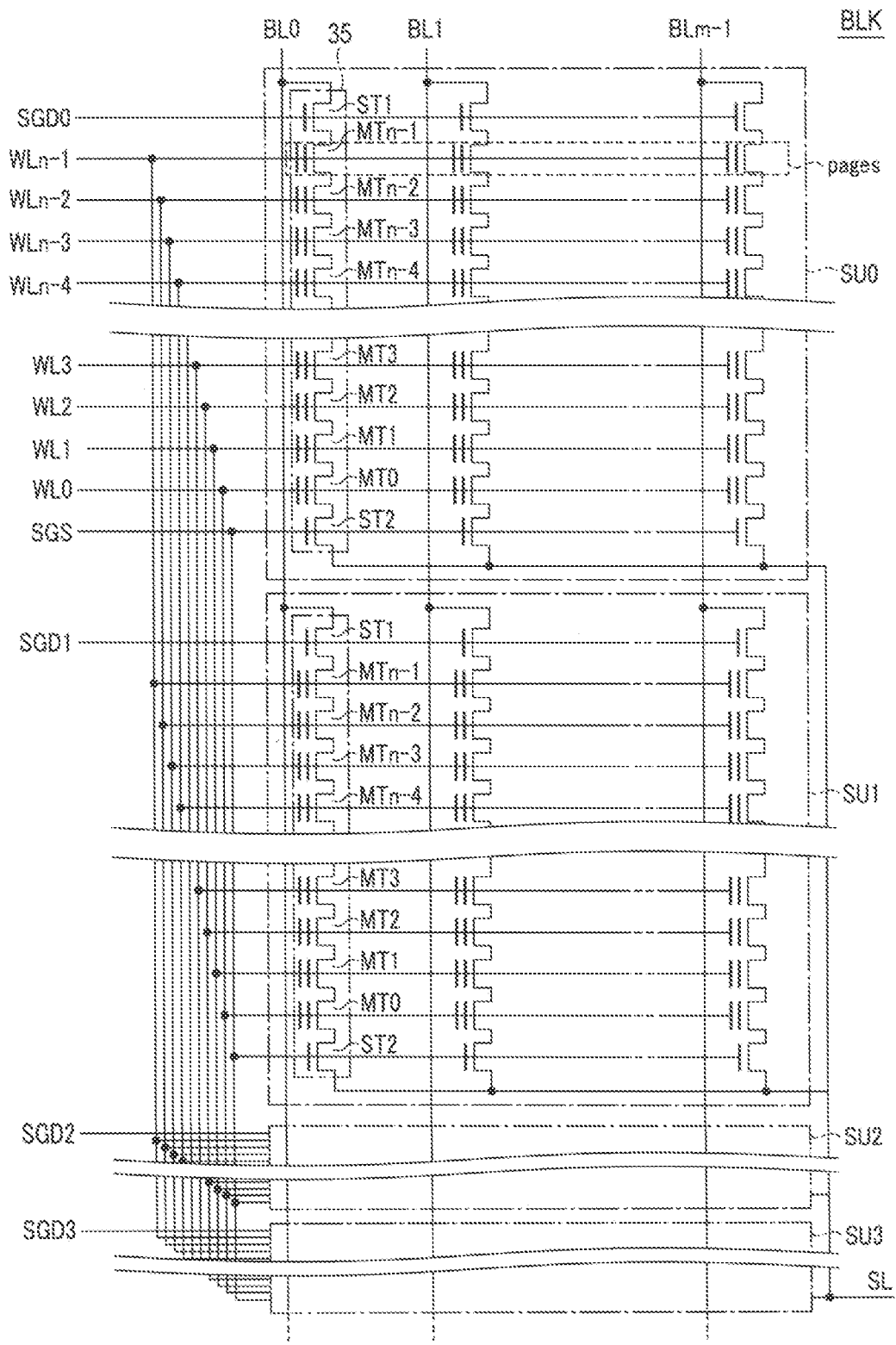
FIG. 3 is a circuit diagram illustrating a block in the semiconductor storage device according to the first embodiment.

As illustrated in FIG. 3, the NAND string 35 includes n memory cell transistors MT (MT0 to MTn−1) and selection transistors ST1 and ST2. The memory cell transistor MT includes a control gate and a charge storage layer and retains data in a nonvolatile manner. The memory cell transistors MT are connected in series between a first terminal of the selection transistor ST1 and a first terminal of the selection transistor ST2.

Control terminals of the selection transistors ST1 of the string units SU0 to SU3 are connected to select gate lines SGD0 to SGD3. Thus, the control terminals of the selection transistors ST2 of the string units SU0 to SU3 are connected in common to, for example, a select gate line SGS, but may be connected to different select gate lines SGS0 to SGS3 of the string units. Control terminals of the memory cell transistors MT0 to MTn−1 in the same block BLK are commonly connected to word lines WL0 to WLn−1.

The second terminals of the selection transistors ST1 of the NAND strings 35 at the same column inside the memory cell array 11A are commonly connected to any bit line BL (BL0 to BLm−1). That is, the bit lines BL commonly connect the NAND strings 35 between the plurality of blocks BLK. Further, the second terminals of the plurality of selection transistors ST2 are commonly connected to a source line SL.

That is, the string unit SU is an aggregate of the NAND strings 35 connected to the different bit lines BL and connected to the same select gate line SGD. The block BLK is an aggregate of the plurality of string units SU that commonly use the word lines WL. The memory cell array 11A is an aggregate of the plurality of blocks BLK that commonly use the bit lines BL.

Data is written or read en bloc on or from the memory cells MT connected to any of word lines WL inside the string unit SU. The unit of word lines is referred to as pages.

On the other hand, erasing of data can be performed in units of blocks BLK or units smaller than the block BLK. An erasing method is disclosed in, for example, U.S. patent application Ser. No. 13/235,389, a "NONVOLATILE SEMICONDUCTOR MEMORY DEVICE," filed on Sep. 18, 2011. An erasing method is also disclosed in U.S. patent application Ser. No. 12/694,690, a "NONVOLATILE SEMICONDUCTOR STORAGE DEVICE," filed on Jan. 27, 2010. An erasing method is also disclosed in U.S. patent application Ser. No. 13/483,610, "NONVOLATILE SEMICONDUCTOR MEMORY DEVICE AND DATA ERASE METHOD THEREOF," filed on May 30, 2012, the entire contents of foregoing list of patent applications are incorporated herein by reference.

Figure 4:
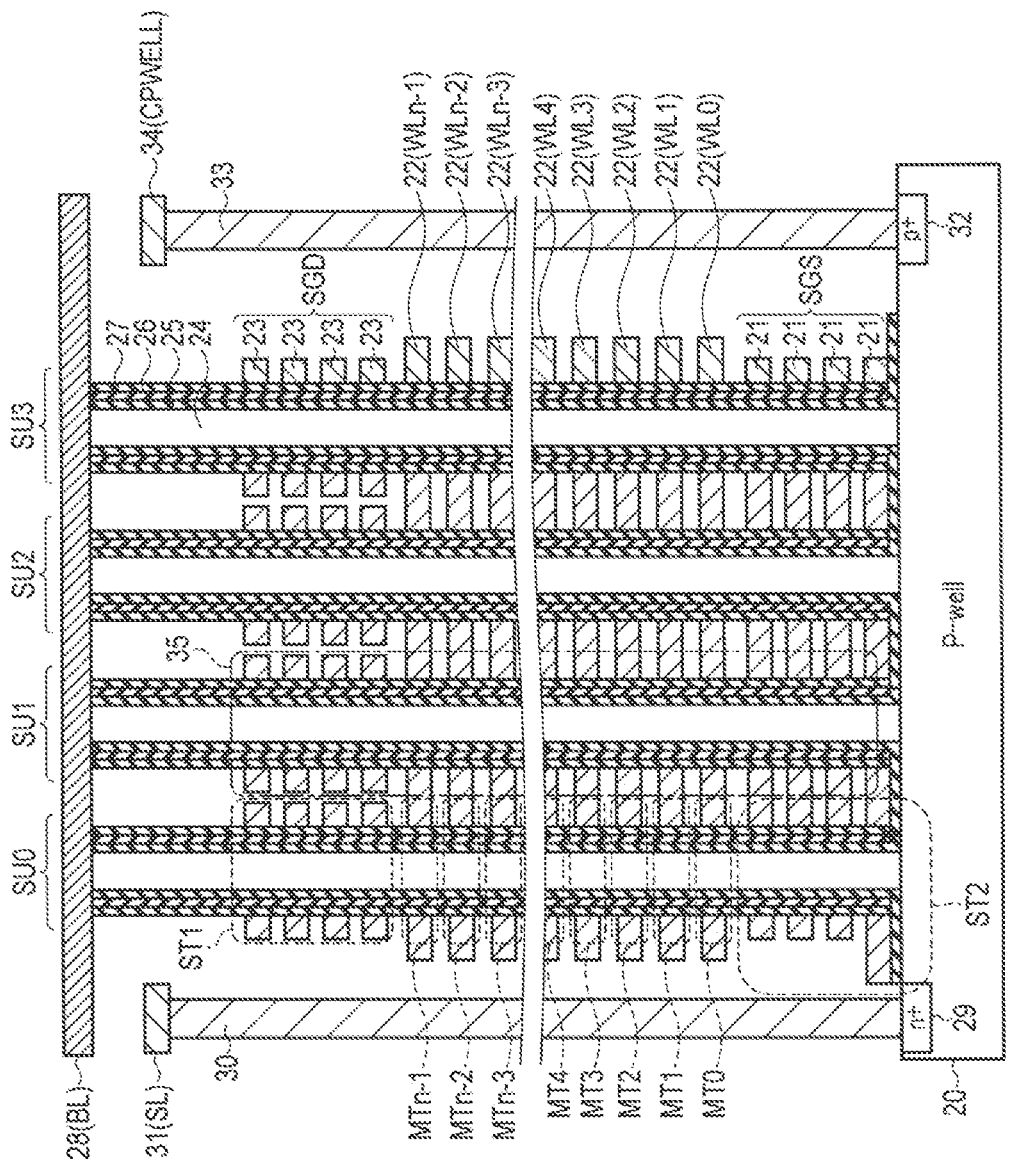
FIG. 4 is a cross-sectional view illustrating the block in the semiconductor storage device according to the first embodiment.

As illustrated in FIG. 4, the plurality of NAND strings 35 are provided on a p-type well region 20, which may be a region of a semiconductor substrate. For example, four wiring layers 21, functioning as select gate lines SGS, n-number of wiring layers 22, functioning as word lines WL (e.g., WL0 to WLn−1), and four wiring layers 23, functioning as select gate lines SGD, are sequentially stacked on the well region 20. Insulating layers (not specifically illustrated) are formed between these stacked wiring layers.

Pillar-like (column-like) conductors 24 passing through these wiring layers 21, 22, and 23 and reaching the well region 20 are provided. A gate insulation layer 25, a charge storage layer (which can be an insulating layer or a conductive layer) 26, and a block insulating layer 27 are sequentially provided on a side surface of the conductor 24. The conductor 24, the gate insulation layer 25, the charge storage layer 26, and the block insulating layer 27 configure the memory cell transistor MT and the selection transistors ST1 and ST2. Each conductor 24 functions as a current path of a NAND string 35 and is a region in which a channel of each transistor is formed. The upper end of the conductor 24 is connected to a metal wiring layer 28 that functions as a bit line BL.

An $n^+$ type impurity diffusion layer 29 is provided inside a region at the surface of the well region 20. A contact plug 30 is provided on the diffusion layer 29. The contact plug 30 is connected to a metal wiring layer 31 that functions as a source line SL. Further, a $p^+$ type impurity diffusion layer 32 is provided in a region at the surface of the well region 20. A contact plug 33 is provided on the diffusion layer 32. The contact plug 33 is connected to a metal wiring layer 34 that functions as a well wiring CPWELL. The well wiring CPWELL is a wiring for applying a potential to the conductor 24 via the well region 20.

A plurality of the foregoing described configurations are arrayed along a direction (referred to as a "depth direction") into the page of FIG. 4. The string unit SU includes a set of NAND strings 35 arranged in the depth direction.

Furthermore, another configuration may be used as the configuration of the memory cell array 11A. For example, the configuration of the memory cell array 11A may be as disclosed in U.S. patent application Ser. No. 12/407,403, "THREE DIMENSIONAL STACKED NONVOLATILE SEMICONDUCTOR MEMORY," filed on Mar. 19, 2009. Or the configuration of the memory cell array 11A can be as disclosed in U.S. patent application Ser. No. 12/406,524, "THREE DIMENSIONAL STACKED NONVOLATILE SEMICONDUCTOR MEMORY," filed on Mar. 18, 2009; U.S. patent application Ser. No. 12/679,991, "NONVOLATILE SEMICONDUCTOR STORAGE DEVICE AND METHOD OF MANUFACTURING THE SAME," filed on Mar. 25, 2010; or U.S. patent application Ser. No. 12/532,030, "SEMICONDUCTOR MEMORY AND METHOD FOR MANUFACTURING SAME" filed on Mar. 23, 2009, the entire contents each of which are incorporated herein by reference.

Figure 5:
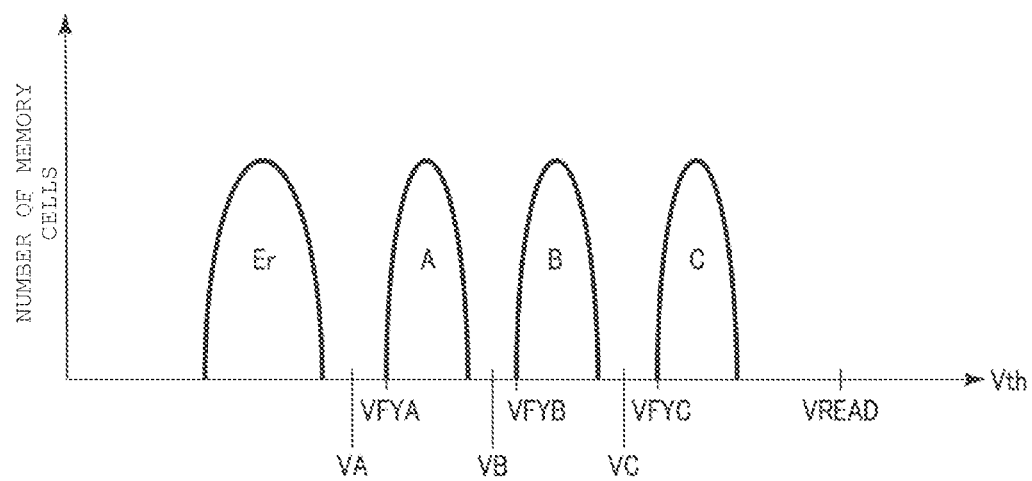
FIG. 5 depicts threshold distributions of a memory cell transistor in the semiconductor storage device according to the first embodiment.

FIG. 5 illustrates an example in which the memory cell transistor MT stores 2-bit (4-value) data.

As illustrated in FIG. 5, a threshold voltage of the memory cell transistor MT can be written to have a value included in one of four discrete distributions. These four distributions are referred to as an Er level, an A level, a B level, and a C level in this order from lower to higher thresholds.

The Er level is equivalent to, for example, a data erase state. The threshold voltages included in the Er level are less than a verification voltage VFYA and can have a positive or negative voltage value.

The A to C levels are states in which charges have been injected to a charge storage layer and data has been specifically written to the memory cell. The thresholds included in the distributions of the A to C levels have, for example, positive values. The threshold voltages included in the A level are equal to or greater than the verification voltage VFYA and less than a verification voltage VFYB. The threshold voltages included in the B level are equal to or greater than the verification voltage VFYB and are less than a verification voltage VFYC. The threshold voltages included in the C level are equal to or greater than the verification voltage VFYC and are less than a read pass voltage VREAD. In general, a relationship of VFYA<VFYB<VFYC<VREAD is satisfied.

A read voltage VA is set to be between the Er level and the A level, a read voltage VB is set to be between the A level and the B level, and a read voltage VC is set to be between the B level and the C level. The read voltage relationship, in general, satisfies the following: VA<VFYA, VB<VFYB, and VC<VFYC. The memory cell transistors MT to which the read voltages VA, VB, and VC are applied are turned on or off in accordance with the stored data therein, and it can be determined whether the threshold voltages of the memory cell transistors are greater or less than the applied read voltages. The read pass voltage VREAD is a voltage greater than an upper limit of the highest threshold voltage distribution (here, the C level) and the memory cell transistor MT to which the read pass voltage VREAD is applied is turned on regardless of the stored data therein.

As described above, each memory cell transistor MT can have any of the four threshold distributions and can take any of four kinds of different states. By allocating to these each of these four different possible states a binary notation value ("00" to "11"), each memory cell transistor MT can be operated to retain 2-bit data.

Embodiments can also be applied to memory cell transistors MT capable of storing data of 3 bits or more. Similarly, embodiments can be applied to memory cell transistors MT capable of storing only 1-bit data.

Figure 6:
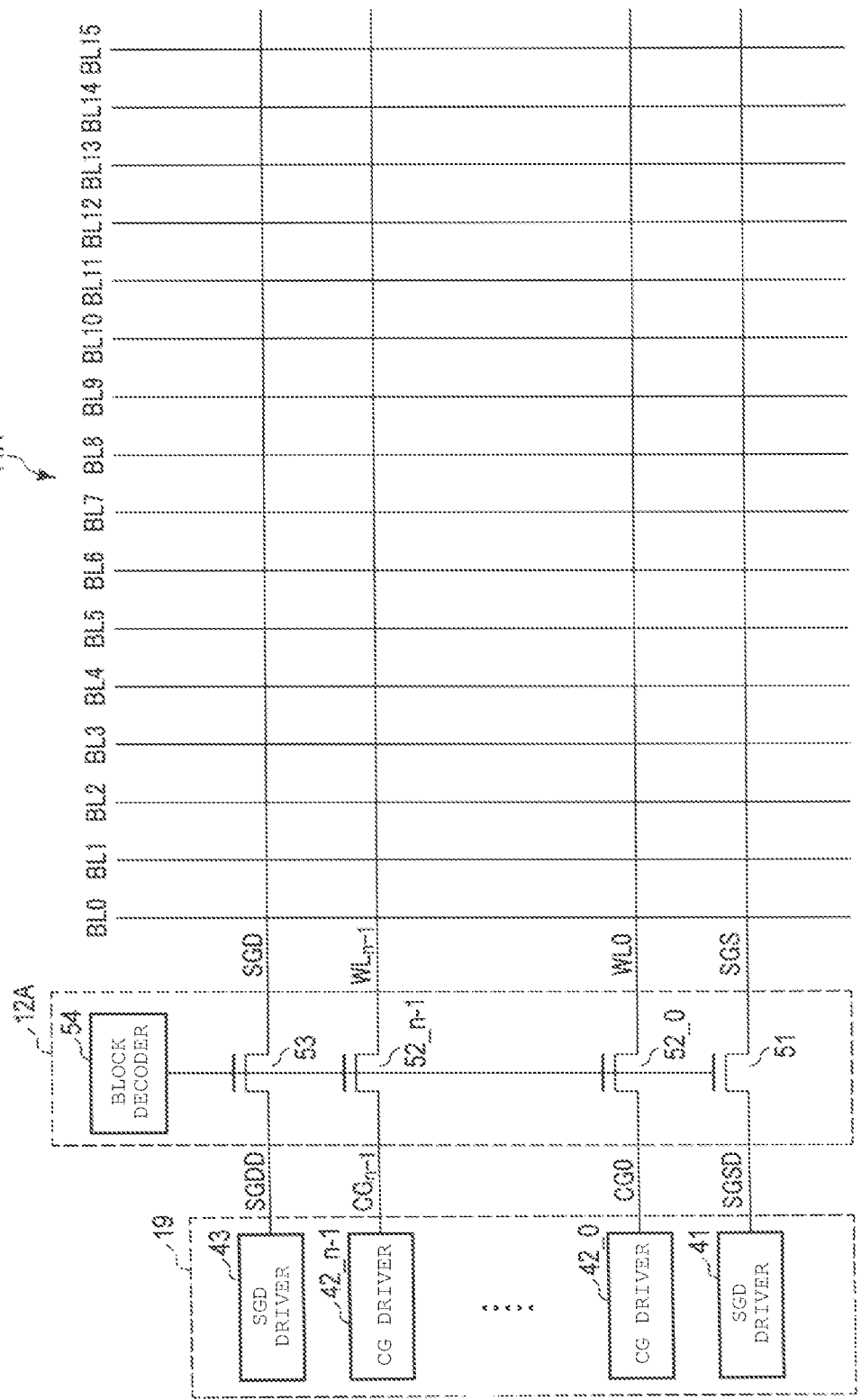
FIG. 6 is a diagram illustrating a row decoder, a voltage generation circuit, and the memory cell array in the semiconductor storage device according to the first embodiment.

In FIG. 6, the row decoder 12A and the voltage generation circuit 19 are illustrated.

As illustrated in FIG. 6, the row decoder 12A includes transmission transistors 51, 52 (52_0 to 52_n−1 corresponding to the word lines WL), and 53 and a block decoder 54.

In the transmission transistor 51, a first terminal is electrically connected to a wiring SGSD and a second terminal is electrically connected to the select gate line SGS. In the transmission transistors 52_0 to 52_n−1, first terminals are electrically connected to the word lines WL0 to WLn−1 and second terminals are electrically connected to control gate lines CG0 to CGn−1. In the transmission transistor 53, a first terminal is electrically connected to a wiring SGDD and a second terminal is electrically connected to a select gate line SGD. Signals from the block decoder 54 are supplied to control terminals of the transmission transistors 51, 52, and 53.

The block decoder 54 decodes block addresses. The block decoder 54 supplies signals (voltages) to the control terminals of the transmission transistors 51, 52, and 53 for turning on or off the transmission transistors 51, 52, and 53 according to decoding results of the block addresses. More specifically, when corresponding blocks are selected, the block decoder 54 supplies voltages for turning on the transmission transistors 51, 52, and 53. Conversely, when the corresponding blocks are not selected, the block decoder 54 supplies voltages for turning off the transmission transistors 51, 52, and 53. Here, a state in which the transistors are turned on refers to a state in which the transistor transmits an applied voltage from the first terminal to the second terminal.

The voltage generation circuit 19 includes an SGS driver 41, CG drivers 42 (42_0 to 42_n−1), and an SGD driver 43.

The SGS driver 41 generates a voltage necessary on the select gate line SGS and supplies the voltage to the wiring SGSD during various operations. The transmission transistor 51 transmits a voltage from the SGS driver 41 to the select gate line SGS under the control of the block decoder 54.

The CG drivers 42_0 to 42_n-1 generate voltages necessary on the word lines WL0 to WLn-1 and supply these voltages to the control gate lines CG0 to CGn-1 during various operations. The transmission transistors 52_0 to 52_n-1 transmit the voltages from the CG drivers 42_0 to 42_n-1 to the word lines WL0 to WLn-1 under the control of the block decoder 54.

The SGD driver 43 generates a voltage necessary on the select gate line SGD and supplies the voltage to the wiring SGDD during various operations. The transmission transistor 53 transmits the voltage from the SGD driver 43 to the select gate line SGD under the control of the block decoder 54.

Read Operation of First Embodiment

Figure 7:
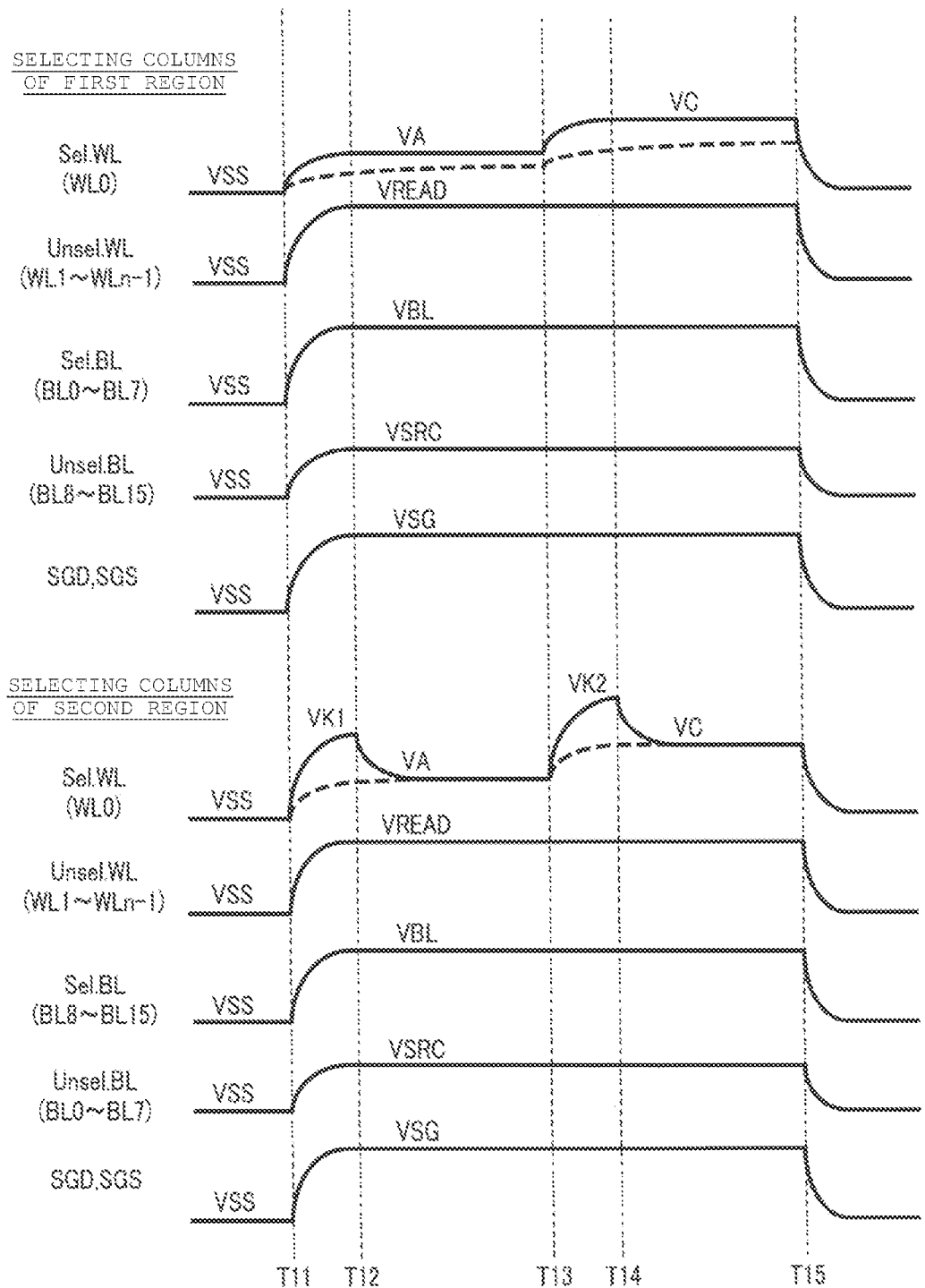
FIG. 7 is a timing chart illustrating various voltages during a read operation in the semiconductor storage device according to the first embodiment.

Hereinafter, a read (reading) operation according to the first embodiment will be described with reference to FIGS. 7 to 9. FIG. 7 is a timing chart illustrating various voltages at the time of selecting columns of a first region and the time of selecting columns of a second region in a read operation. FIG. is a diagram illustrating the voltages at the time of selecting columns of the first region in the read operation and FIG. 9 is a diagram illustrating the voltages at the time of selecting the columns of the second region in the read operation.

Figure 8:
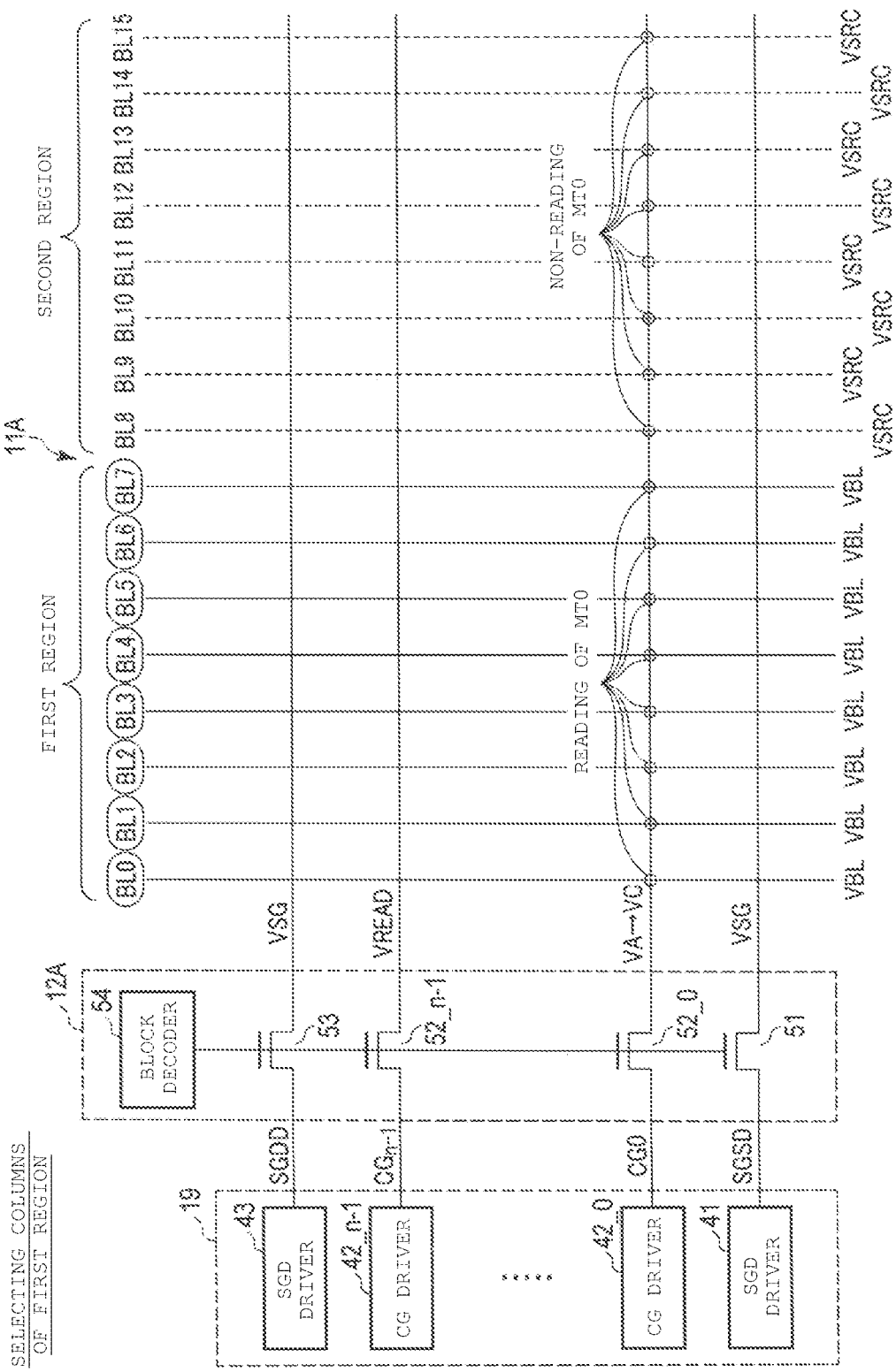
FIG. 8 is a diagram illustrating aspects of a read operation in the semiconductor storage device according to the first embodiment.
Figure 9:
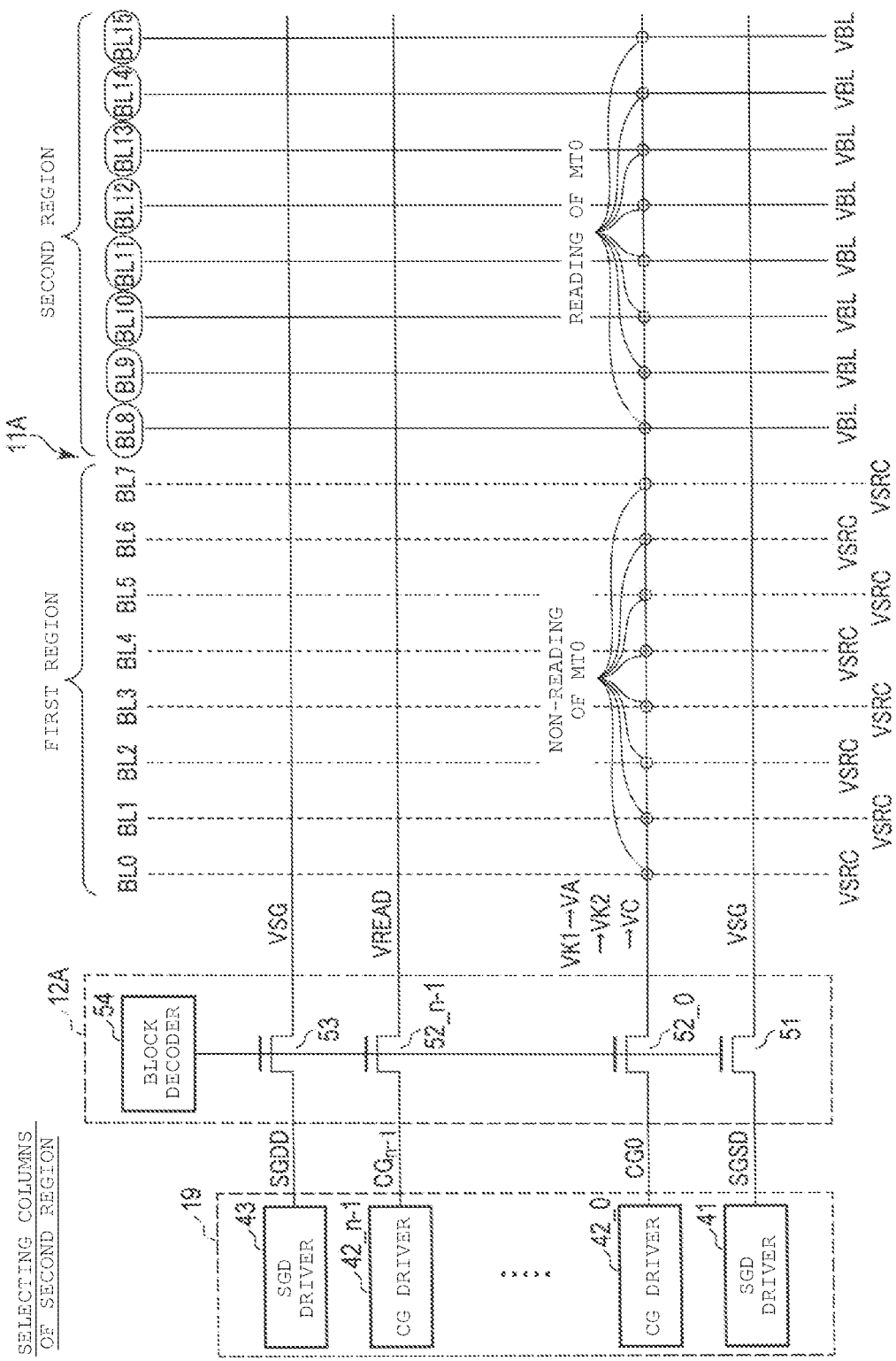
FIG. 9 is a diagram illustrating aspects of a read operation in the semiconductor storage device according to the first embodiment.

As illustrated in FIGS. 7 to 9, in this example, the memory cell array 11A can be considered to be divided into two regions (e.g., the first and second regions) according to column units (units of bit lines BL) and the read operation can be performed in each region separately. The first and second regions boundaries are set here according to distances from the voltage generation circuit 19 (a CG driver 42). More specifically, the first region is the region generally closer to the CG driver 42 and the second region is the region generally more distant from the CG driver 42. Here, an example is illustrated in which there are bit lines BL0 to BL15 provided in the memory cell array 11A, the first region is set to include the bit lines BL0 to BL7, and the second region is set to include the bit lines BL8 to BL15. The voltages to be supplied to the selected word lines WL during the reading operation are controlled and set separately for selection of the columns in the first region and selection of the columns in the second region.

First, a timing chart in the case of the selection of the columns (the bit lines BL0 to BL7) in the first region during a reading operation will be described with reference to FIGS. 7 and 8.

In FIG. 7, "Sel.WL" indicates a selected word line, "Unsel.WL" indicates a non-selected word line, "Sel.BL" indicates a selected bit line, and "Unsel.BL" indicates a non-selected bit line. The solid line in timing chart for the selected word line WL (the "Sel.WL" row) indicates a voltage waveform for a portion of the selected word line WL close to (physical proximity) the CG driver 42 (for example, a portion of a selected word line located in the first region and this close-in word line portion is referred to as a "first portion" in description below). This solid line for Sel.WL is substantially the same as the voltage supplied from the CG driver 42. On the other hand, a dotted line in the timing cart of the selected word line WL (the "Sel.WL" rows) depicts the voltage waveform for a portion of the selected word line WL relatively distant from the CG driver 42 (for example, a portion of the selected word line WL located in the second region and this distant word line portion is referred to as a "second portion" in description below). The difference in solid and dotted line values for the selected word line is because the voltage from the CG driver 42 is delayed and applied depending on the distance of the word line WL portion from the CG driver 42. Here, an example in which the word line WL0 has been selected is illustrated. FIG. 7 illustrates an example in which reading using the voltage VA and reading using the voltage VC are sequentially performed.

As illustrated in FIGS. 7 and 8, the various voltages depicted are at a voltage level VSS during an initial state (the time before time T11).

Then, at time T11, the CG drivers 42_1 to 42_n-1 supply the voltage VREAD to non-selected word lines WL1 to WLn-1. Accordingly, the memory cell transistors MT1 to MTn-1 connected to the non-selected word lines WL1 to WLn-1 are turned on regardless of the threshold.

At time T11, the SGS driver 41 supplies the voltage VSG to the select gate line SGS and the SGD driver 43 supplies the voltage VSG to the select gate line SGD. The voltage VSG is a voltage for turning on the selection transistors ST1 and ST2.

At time T11, a voltage VBL (which is less than VREAD) is applied to the selected bit lines BL0 to BL7 and a voltage VSRC (which is less than VBL) is applied to the non-selected bit lines BL8 to BL15.

At time T11, the CG driver 42_0 supplies the voltage VA to the selected word line WL0. Thus, the voltage VA is applied to the first portion of the selected word line WL0. Thus, reading is performed in accordance with the voltage VA of the memory cell transistor MT0 connected to the selected word line WL0 and connected to the selected bit lines BL0 to BL7 (located in the first region).

A voltage less than the voltage VA is, in effect, applied to or received by the second portion of the selected word line WL0. In other words, the second portion of the selected word line WL0 does not reach the voltage VA necessary for the reading (does not reach to the voltage VA) due to long-distance between the voltage application spot on the selected word line WL0 and the second portion. However, in this embodiment, the columns of the second region in which the second portion of the selected word line WL0 is located are non-selected. Therefore, reading of the memory cell transistor MT0 connected to the selected word line WL0 and connected to the selected bit lines BL8 to BL15 (located in the second region) is not necessary. Accordingly, there is no reading error in the read operation in this example.

Subsequently, at time T13, the CG driver 42_0 supplies the voltage VC to the selected word line WL0. Thus, the voltage VC is applied to the first portion of the selected word line WL0. Then, reading is performed in accordance with the voltage VC of the memory cell transistor MT0 connected to the selected word line WL0 and connected to the selected bit lines BL0 to BL7 (located in the first region).

At this time, a voltage less than the voltage VC is, in effect, applied to or received by the second portion of the selected word line WL0. In other words, the second portion of the selected word line WL0 does not reach the voltage VC necessary for the reading operation due to the long-distance. However, as was the case at the time of the reading at voltage VA level, no problem occurs in the read operation in this example because the second region bit lines BL are unselected.

Thereafter, at time T15, the various voltages begin to return to the voltage VSS. Thus, each transistor is turned off and the read operation ends.

Next, a timing chart in the case of selection of the columns (the bit lines BL8 to BL15) of the second region in a read operation will be described with reference to FIGS. 7 and 9.

As illustrated in FIGS. 7 and 9, the various depicted voltages are the voltage VSS in an initial state (e.g., before time T11).

At time T11, as was the case in which the columns of the first region were selected, the voltage VREAD is applied to the non-selected word lines WL1 to WLn−1, the voltage VSG is applied to the select gate line SGS, and the voltage VSG is applied to the select gate line SGD. At time T11, the voltage VBL is applied to the selected bit lines BL8 to BL15 and the voltage VSRC is applied to the non-selected bit lines BL0 to BL7.

Further, at time T11, the CG driver 42_0 supplies a voltage VK1 to the selected word line WL0. Thus, the voltage VK1 is applied to the first portion of the selected word line WL0. The voltage VK1 is a relatively large voltage that is temporarily supplied by the CG driver 42_0 and the relation of VK1>VA is satisfied. In accordance with the voltage VK1, the voltage VA is applied to the second portion of the selected word line WL0 without substantial delay (that is, at timing faster than when only the voltage VA is supplied by the CG driver 42_0 to the first portion).

Thereafter, at time T12, the CG driver 42_0 supplies the voltage VA to the selected word line WL0. Thus, the voltage VA is applied to the first portion of the selected word line WL0 at this time. Then, reading is performed in accordance with the nominal voltage VA level of the memory cell transistor MT0 connected to the selected word line WL0 and connected to the selected bit lines BL8 to BL15 (located in the second region).

At this time, the voltage VA is applied to the first portion of the selected word line WL0 after the voltage VK1 is applied. Therefore, in the first portion of the selected word line WL0, it takes some time until voltage stabilization at the voltage VA necessary for the reading occurs. However, the columns of the first region in which the first portion of the selected word line WL0 is located are non-selected. Therefore, reading of the memory cell transistor MT0 connected to the selected word line WL0 and connected to the selected bit lines BL0 to BL7 (located in the first region) is not necessary. Accordingly, a problem does not occur in the read operation in this example.

Subsequently, at time T13, the CG driver 42_0 supplies the voltage VK2 to the selected word line WL0. Thus, the voltage VK2 is applied to the first portion of the selected word line WL0. The voltage VK2 is a relatively large voltage temporarily supplied by the CG driver 42_0 and a relationship of VK2>VC is satisfied. In accordance with the voltage VK2 being applied to the first portion of the selected word line WL0, the voltage VC is applied to the second portion of the selected word line WL0 without delay (that is, faster than when just voltage VC is supplied to the first portion).

Thereafter, at time T14, the CG driver 42_0 supplies the voltage VC to the selected word line WL0. Thus, the voltage VC is applied to the first portion of the selected word line WL0. Then, reading is performed in accordance with the voltage VC on the memory cell transistor MT0 connected to the selected word line WL0 and connected to the selected bit lines BL8 to BL15 (located in the second region).

At this time, the voltage VC is applied to the first portion of the selected word line WL0 after the voltage VK2 has been applied. Therefore, it takes some time until stabilization at the voltage VC level necessary for the reading to occur in the first portion of the selected word line WL0.

However, as was the case at the time of reading in accordance with the voltage VA, a problem does not occur in the read operation in this example.

Thereafter, at time T15, the various voltages return to voltage VSS. Thus, each transistor is turned off and the read operation ends.

Even when the columns of the first region are being selected, the CG driver 42_0 may supply the temporarily large voltages VK1' and VK2' to the selected word line WL0 at time T11 and time T13, respectively. Here, a relationship of VK1' <VK1 and a relationship of VK2'<VK2 are satisfied.

Command Sequence of First Embodiment

In the above-described read operation, eight bit lines BL, for example, are set as read units and eight bit lines BL in one of the first or second region are selected. When the first region is selected, the voltages VA and VC are supplied in sequence to the selected word lines WL. Conversely, when the second region is selected, the voltages VK1, VA, VK2, and VC are supplied in sequence to the selected word lines WL. The setting of a special read mode, that is, the setting of the read units and the selection of the read region, comply with a received command.

Hereinafter, a command sequence by which the read operation is performed will be described with reference to FIGS. 10 and 11. In the following description, a command, an address, and data are issued from the outside (e.g., a memory controller or the like) and are received by the semiconductor storage device 100. The command, the address, and the data are input in synchronization with assertion of each signal.

Figure 10:
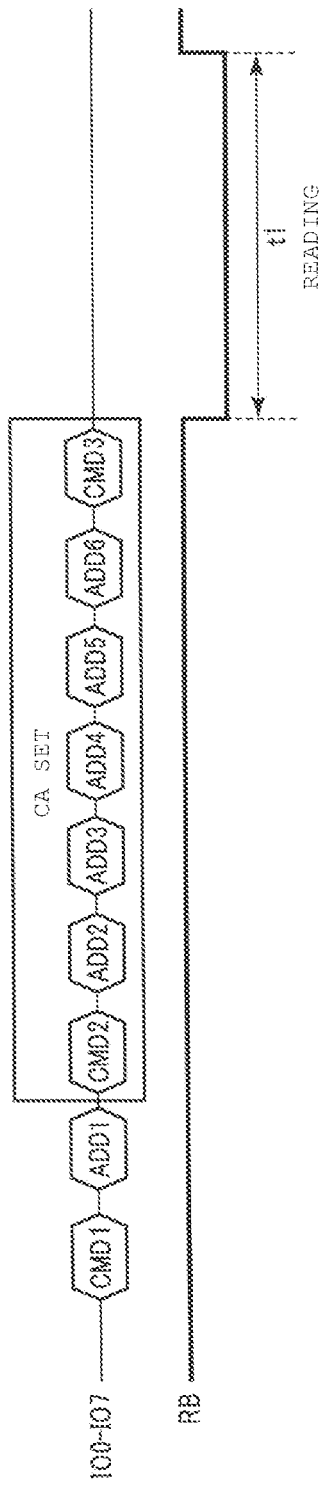
FIG. 10 is a diagram illustrating a first example of a command sequence in the semiconductor storage device according to the first embodiment.

A first example illustrated in FIG. 10 is an example in accordance with a special command sequence.

As illustrated in FIG. 10, in the first example, the semiconductor storage device 100 first receives a command CMD1. The command CMD1 is a special command and is a command for selecting the special read mode. Here, the command CMD1 is a command for setting the read units. More specifically, the command CMD1 is used to set eight bit lines BL as the read units.

Subsequently, the semiconductor storage device 100 receives an address ADD1. The address ADD1 is an address for designating a region in which data is to be read in the special reading by the command CMD1. More specially, the address ADD1 can be an address for designating, for example, the plane 10A and the first region.

The special read mode is set in accordance with the command CMD1 and the address ADD1. That is, by the setting of the read units and the selection of the read region as in the above example a reading operation is performed and voltages to be supplied to the selected word lines WL are determined according to the selected read region being the first or second region.

Subsequently, the semiconductor storage device 100 receives a command/address (CA) set. The CA set is normally a set of a command and an address necessary to perform the reading.

More specifically, the semiconductor storage device 100 first receives a command CMD2. The command CMD2 is a command for ordering to input an address in reading. Subsequently, the semiconductor storage device 100 receives addresses ADD (ADD2 to ADD6) over the course of, for example, five cycles. The addresses ADD2 to ADD6 are addresses for designating addresses for reading data and are used to designate, for example, a block, a partial block (string units), a row (word line), and columns (bit lines). More specifically, for example, the block BLK0, the string unit SU0, the word line WL0, and the bit lines BL0 to BL7 can be selected. The number of selected bit lines BL0 to BL7 is based on a setting by the above-described command CMD1. Thereafter, the semiconductor storage device 100 receives a command CMD3. The command CMD3 is a command for ordering performance of the reading.

The semiconductor storage device 100 enters a busy state (RB="L" level) and starts the reading in response to the command CMD3. During a period t1, which is the busy state, the reading is performed. Here, eight bit lines BL are set as read units and the first region is read. Accordingly, the voltages VA and VC are supplied in sequence to the selected word lines WL. Thereafter, the semiconductor storage device 100 enters a ready state (RB="H" level) and ends the reading.

Figure 11:
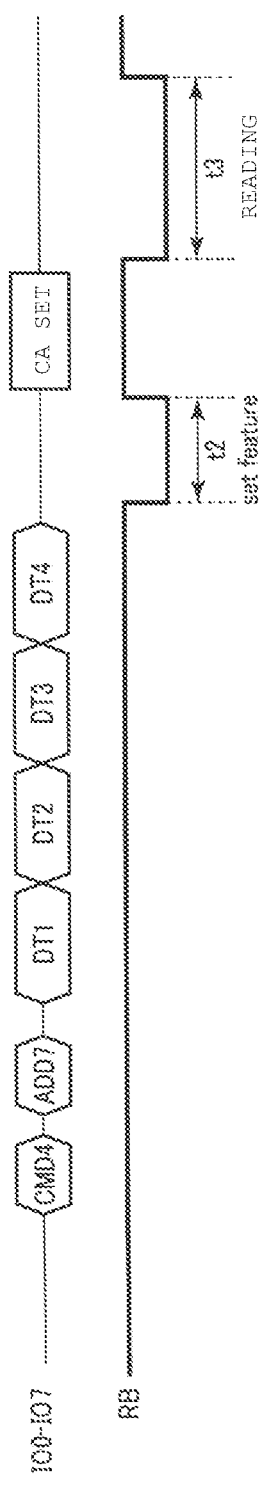
FIG. 11 is a diagram illustrating a second example of a command sequence in the semiconductor storage device according to the first embodiment.

A second example illustrated in FIG. 11 is an example in accordance with a set feature command sequence.

As illustrated in FIG. 11, in the second example, the semiconductor storage device 100 first receives a command CMD4. The command CMD4 is a command for ordering a change in parameters in the semiconductor storage device 100.

Subsequently, the semiconductor storage device 100 receives an address ADD7. The address ADD7 is an address for designating an address corresponding to a parameter desired to be changed. Here, the changed parameter is the read mode setting.

Subsequently, the semiconductor storage device 100 receives data DT (DT1 to DT4) over, for example, four cycles. The data DT is data equivalent to parameters to be changed. Here, the data DT includes, for example, the read units, the read regions, and the voltages to be supplied to the selected word lines WL.

Thus, the semiconductor storage device 100 enters a busy state and starts set feature. During a period t2, which is the busy state, the set feature is performed and the set parameters can be rewritten.

In this way, the special read mode is set in accordance with the command CMD4, the address ADD7, and the data DT. That is, the setting of the read units and the selection of the read region in this example are performed and voltages to be supplied to the selected word lines WL are determined according to the selected read region by adjusting values of read operation set parameters.

When the set feature ends, the semiconductor storage device 100 is set to the special read mode. Accordingly, when the command/address (CA) set is received, the semiconductor storage device 100 enters the busy state and starts the reading. During a period t3, which is a busy state, the same reading as the reading during the period t1 in FIG. 10 is performed.

Advantages of First Embodiment

Figure 12:
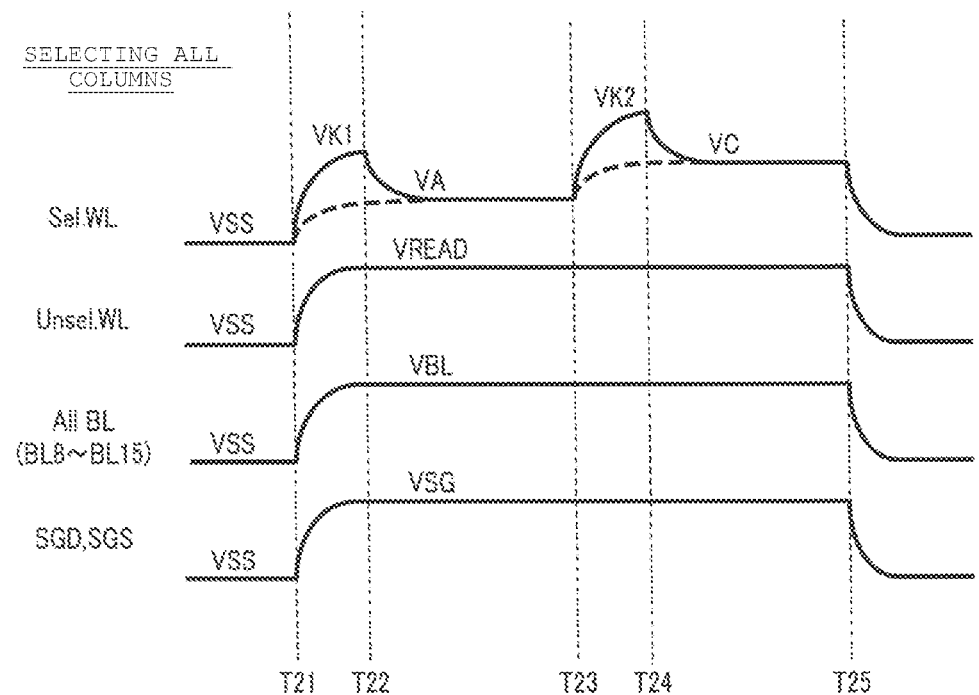
FIG. 12 is a timing chart illustrating various voltages of a read operation in a semiconductor storage device according to a comparative example.

As illustrated in FIG. 12, in a comparative example, all of the columns (the bit lines BL0 to BL15) are selected and the read operation is performed. The voltages VK1, VA, VK2, and VC are supplied in sequence to the selected word lines WL. That is, in the comparative example, at time T21 to time T25, all of the bit lines BL0 to BL15 are selected and voltages in the case of the selection of the second region in the foregoing first embodiment are supplied to the selected word lines WL.

At this time, by supplying the voltages VK1 and VK2 to the selected word lines WL, the second portion (the portion distant from the CG driver 42) of the selected word lines WL can be boosted to the voltages VA and VC rapidly. However, the first portion (the portion close to the CG driver) of the selected word lines WL is also boosted to the voltages VK1 and VK2. Therefore, it takes some time until the first portion drops to the appropriate voltages VA and VC for reading. As a result, in particular, it takes some additional time to read the memory cell transistors MT on the first portion side of the selected word lines WL since reading of the first portion must wait until the voltage stabilizes at the appropriate level VA or VC. A large voltage is applied temporarily to the first portion of the selected word lines WL and the memory cell transistors MT on the first portion side can be turned on in some cases. Thus, noise occurs from the word lines WL to the bit lines BL in some cases, a delay time is necessary for the bit lines BL to be stabilized, and thus it takes further additional time to perform reading in the comparative example.

In the first embodiment, however, the memory cell array 11A is conceptually divided into the first region (the region close to the CG driver 42) and the second region (the region distant from the CG driver 42) as groups/units of columns (bit lines BL) and the read operation is separately performed in each region. The voltages to be supplied to the selected word lines WL are appropriately controlled for the case of selection of the columns of the first region and for the case of selection of the columns of the second region. Thus, the read voltages (VA and VC) can be applied rapidly to the first or second portion of the selected word lines WL, and thus it is possible to achieve a shortening of the read time.

More specifically, as illustrated in FIG. 7, when the columns of the first region are selected, the voltages VA and VC are supplied in sequence to the selected word lines WL. Thus, the voltages of the first portion of the selected word lines WL can be boosted to the voltages VA and VC rapidly and stabilized, and thus it is possible to achieve the shortening of the read time. On the other hand, the second portion of the selected word lines WL does not reach the voltages VA and VC necessary for the reading during the reading of the first region. However, since the columns of the second region in which the second portion of the selected word lines WL are located are non-selected, the reading of the memory cell transistors MT in the second region is not necessary. Accordingly, a problem does not occur in the read operation.

As illustrated in FIG. 7, when the columns of the second region are selected, the voltages VK1, VA, VK2, and VC are supplied in sequence to the selected word lines WL. Thus, the voltages of the second portion of the selected word lines WL can be boosted to the voltages VA and VC rapidly to be stabilized, and thus it is possible to achieve the shortening of the read time. However, as noted above, it takes some time until the first portion of the selected word lines WL to be stabilized in accordance with the voltages VA and VC necessary for the reading. However, since the columns of the first region in which the first portion of the selected word lines WL are located are non-selected, the reading of the memory cell transistor MT in the first region is not necessary in this read operation at this time. Accordingly, a problem does not occur in the read operation in this example.

When the columns of the second region in the first embodiment are selected, the voltages VK1 and VK2 can generally be set to be greater than those of the comparative example. Thus, it is possible to boost the voltage of the second portion of the selected word lines WL to the appropriate read voltages VA and VC more rapidly.

In the first embodiment, the memory cell array 11 in the plane 10 is divided into two regions, the first and second regions, but the present disclosure is not limited thereto. The memory cell array 11 may also be divided into three regions or more.

In the first embodiment, a 3-dimensional stacked NAND flash memory has been described as a semiconductor storage device as one example, but the present disclosure is not limited to this example. The present disclosure can also be applied to a two-dimensionally arrayed NAND flash memory.

Second Embodiment

A semiconductor storage device according to a second embodiment will be described with reference to FIGS. 13 to 15. In the second embodiment, reading using a bit line shield scheme is performed. The bit line shield scheme is a scheme of selecting, for example, only odd columns or even columns during a reading process, then reading the other columns in another reading process.

In the second embodiment, points of difference from the first embodiment will be mainly described and repeated aspects will not be described again.

Read Operation of Second Embodiment

Hereinafter, a read operation according to the second embodiment will be described with reference to FIGS. 13 to 15.

Figure 13:
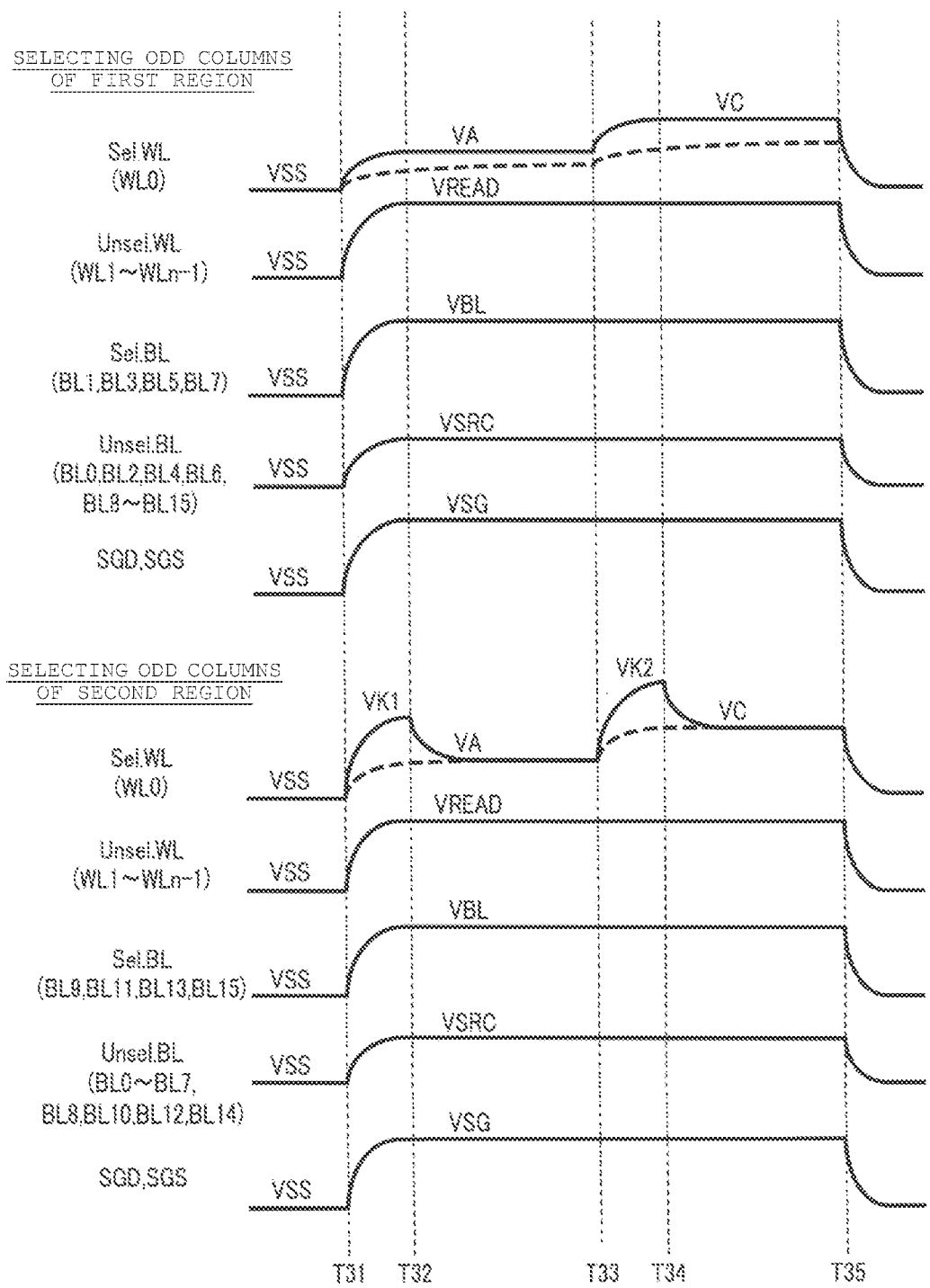
FIG. 13 is a timing chart illustrating various voltages during a read operation in a semiconductor storage device according to a second embodiment.

FIG. 13 is a timing chart illustrating various voltages at the time of selecting odd columns of a first region and the time of selecting odd columns of a second region in a read operation. FIG. 14 is a diagram illustrating the voltages at the time of selecting odd columns of the first region in the read operation and FIG. 15 is a diagram illustrating the voltages at the time of selecting the odd columns of the second region in the read operation.

Figure 14:
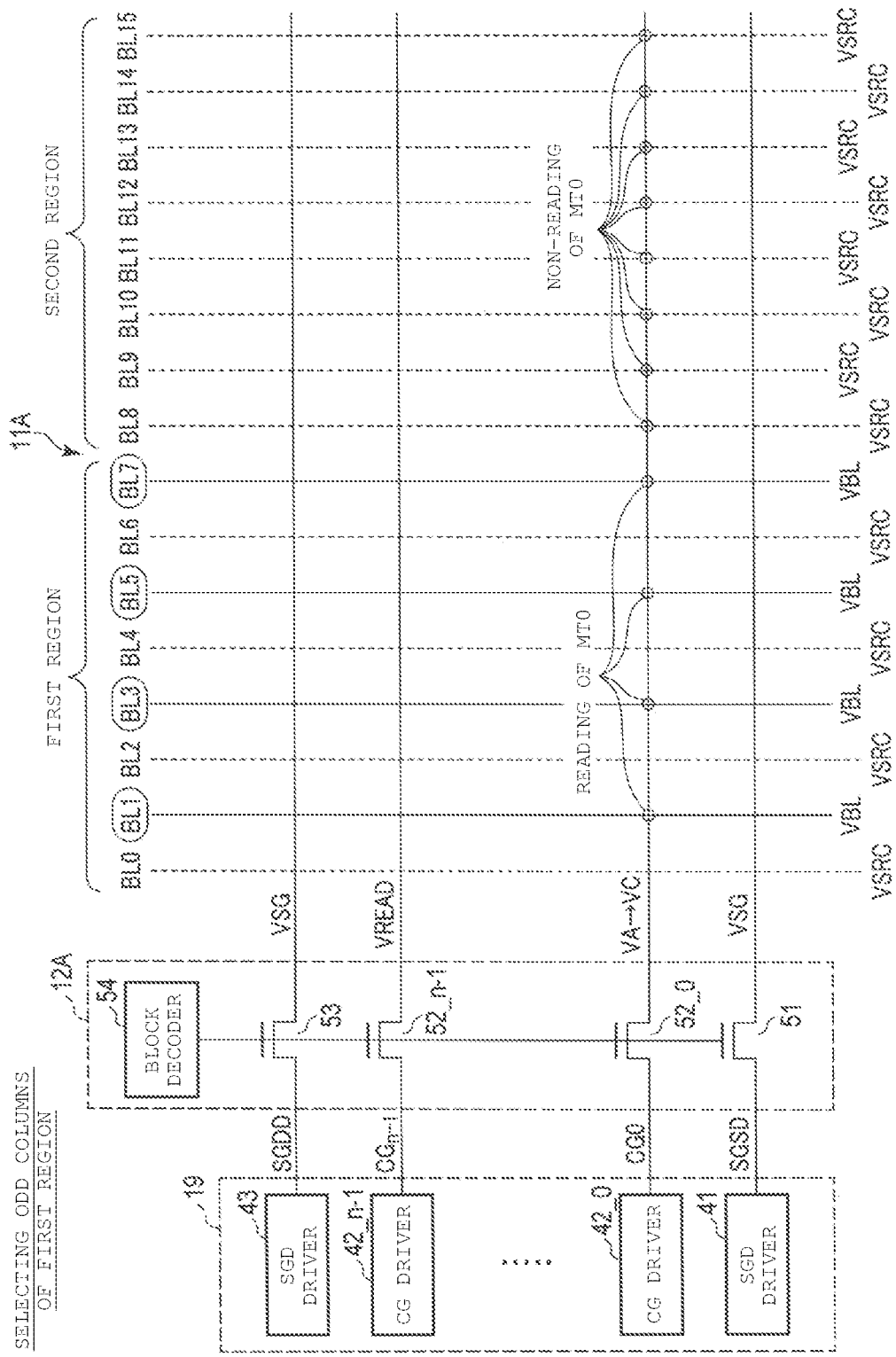
FIG. 14 is a diagram illustrating aspects of the read operation in the semiconductor storage device according to the second embodiment.
Figure 15:
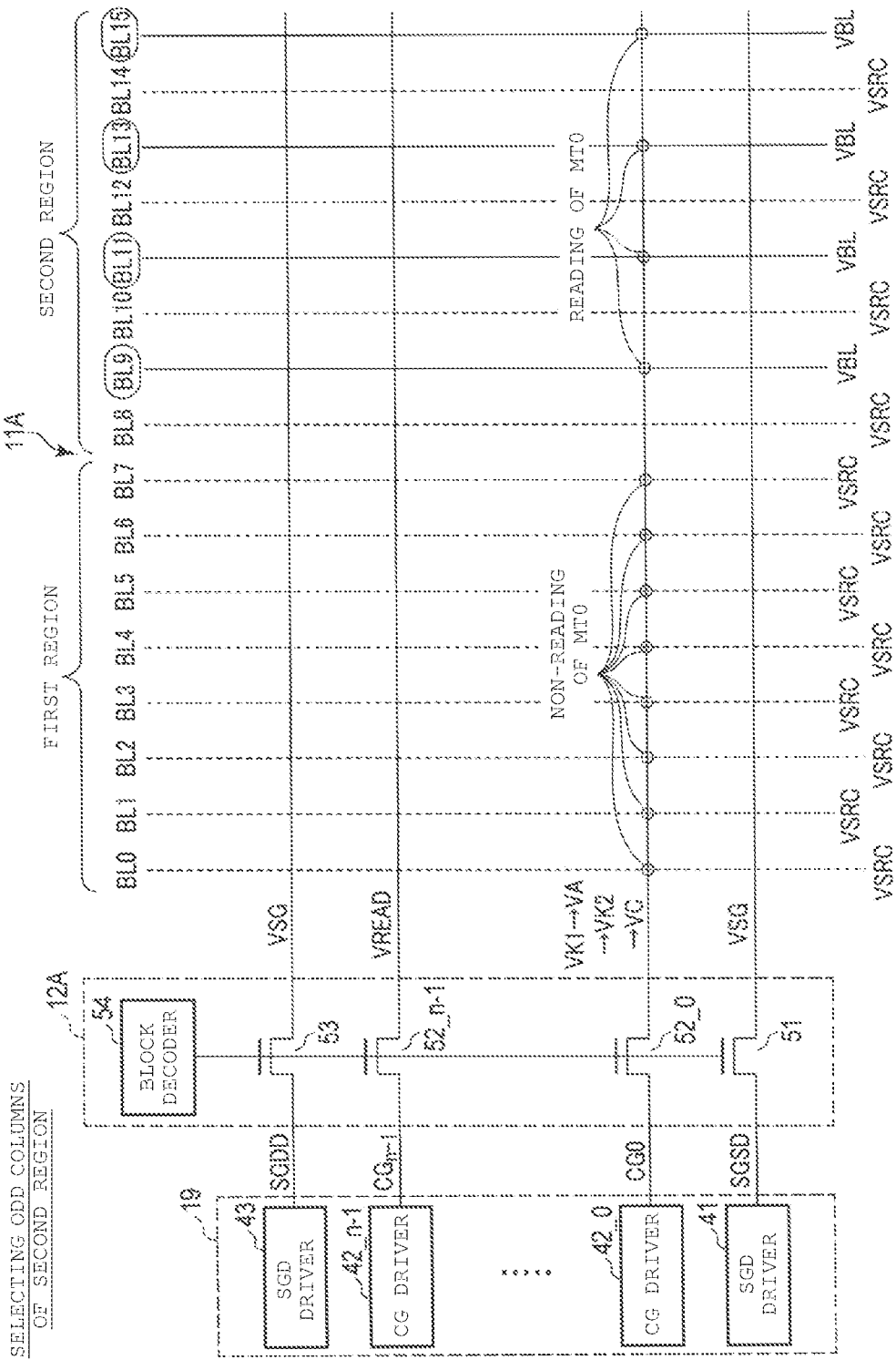
FIG. 15 is a diagram illustrating aspects of the read operation in the semiconductor storage device according to the second embodiment.

As illustrated in FIGS. 13 to 15, in this example, the memory cell array 11A is divided into two regions (first and second regions) in units of columns (units of bit lines BL) and each region is further divided into odd columns and even columns. Voltages to be supplied to the selected word lines WL are appropriately controlled for the case of selection of the columns (e.g., the odd columns or the even columns) in the first region and for the case of selection of the columns (e.g., the odd columns and the even columns) in the second region.

The control for selection of the even columns of each region is substantially the same as the control for selection of the odd columns. Therefore, a case in which the odd columns are selected will be described below as representative of both odd and even column reading.

First, a timing chart in the case of selection of the odd columns (the bit lines BL1, BL3, BL5, and BL7) of the first region in the read operation will be described with reference to FIGS. 13 and 14.

As illustrated in FIGS. 13 and 14, at time T31 to time T35, the voltages VA and VC are applied in sequence to the selected word line WL0 as in the first embodiment. As in the first embodiment, the voltage VREAD is applied to the non-selected word lines WL1 to WLn−1, the voltage VSG is applied to the select gate line SGS, and the voltage VSG is applied to the select gate line SGD.

On the other hand, at time T31 to T35, the voltage VBL is applied to the selected bit lines BL1, BL3, BL5, and BL7 and the voltage VSRC is applied to the non-selected bit lines BL0, BL2, BL4, BL6, and BL8 to BL15, unlike the first embodiment.

Thus, the reading is performed in accordance with the voltages VA and VC of the memory cell transistor MT0 connected to the selected word line WL0 and connected to the selected bit lines BL1, BL3, BL5, and BL7. Conversely, the reading is not performed in accordance with the voltages VA and VC of the memory cell transistor MT0 connected to the selected word line WL0 and connected to the non-selected bit lines BL0, BL2, BL4, BL6, and BL8 to BL15.

At this time, the non-selected bit lines BL0, BL2, BL4, and BL6 in the first region function as shield lines. That is, the non-selected bit lines BL0, BL2, BL4, and BL6 in the first region reduce noise during the read operation of the selected bit lines BL1, BL3, BL5, and BL7 in the first region.

Next, a timing chart in the case of selection of the odd columns (the bit lines BL9, BL11, BL13, and BL15) of the first region in the read operation will be described with reference to FIGS. 13 and 15.

As illustrated in FIGS. 13 and 15, at time T31 to time T35, the voltages VK1, VA, VK2, and VC are applied in order to the selected word line WL0, as in the first embodiment. As in the first embodiment, the voltage VRAD is applied to the non-selected word lines WL1 to WLn−1, the voltage VSG is applied to the select gate line SGS, and the voltage VSG is applied to the select gate line SGD.

Conversely, at time T31 to time T35, the voltage VBL is applied to the selected bit lines BL9, BL11, BL13, and BL15 and the voltage VSRC is applied to the non-selected bit lines BL0 to BL7, BL8, BL10, BL12, and BL14, unlike the first embodiment.

Thus, the reading is performed in accordance with the voltages VA and VC of the memory cell transistor MT0 connected to the selected word line WL0 and connected to the selected bit lines BL9, BL11, BL13, and BL15. Conversely, the reading is not performed in accordance with the voltages VA and VC of the memory cell transistor MT0 connected to the selected word line WL0 and connected to the non-selected bit lines BL0 to BL7, BL8, BL10, BL12, and BL14.

At this time, the non-selected bit lines BL8, BL10, BL12, and BL14 in the second region function as shield lines. That is, the non-selected bit lines BL9, BL11, BL13, and BL15 in the first region reduce noise at the time of the read operation of the selected bit lines BL8, BL10, BL12, and BL14 in the first region.

Advantages of Second Embodiment

In the second embodiment, each of the first and second regions is further divided into the odd columns and the even columns. Thus, the non-selected bit lines BL (for example, the even bit lines BL) function as the shield lines with respect to the selected bit lines BL (for example, the odd bit lines BL). Accordingly, the noise on the selected bit lines BL at the time of the read operation is reduced and the voltages of the selected bit lines BL can be stabilized rapidly. Thus, it is possible to achieve a shortening of the read time.

Third Embodiment

A semiconductor storage device according to a third embodiment will be described with reference to FIG. 16. In the third embodiment, a refresh operation is performed initially in a read operation. In the third embodiment, voltages to be supplied at the time of charging of the selected word lines WL described in the foregoing first embodiment and also at the time of discharging of the selected word lines WL after a refresh operation are appropriately controlled.

In the third embodiment, differences from the first embodiment will be mainly described and similarities and repeated aspects will not be described.

Read Operation of Third Embodiment

Hereinafter, a read operation according to the third embodiment will be described with reference to FIG. 16.

Figure 16:
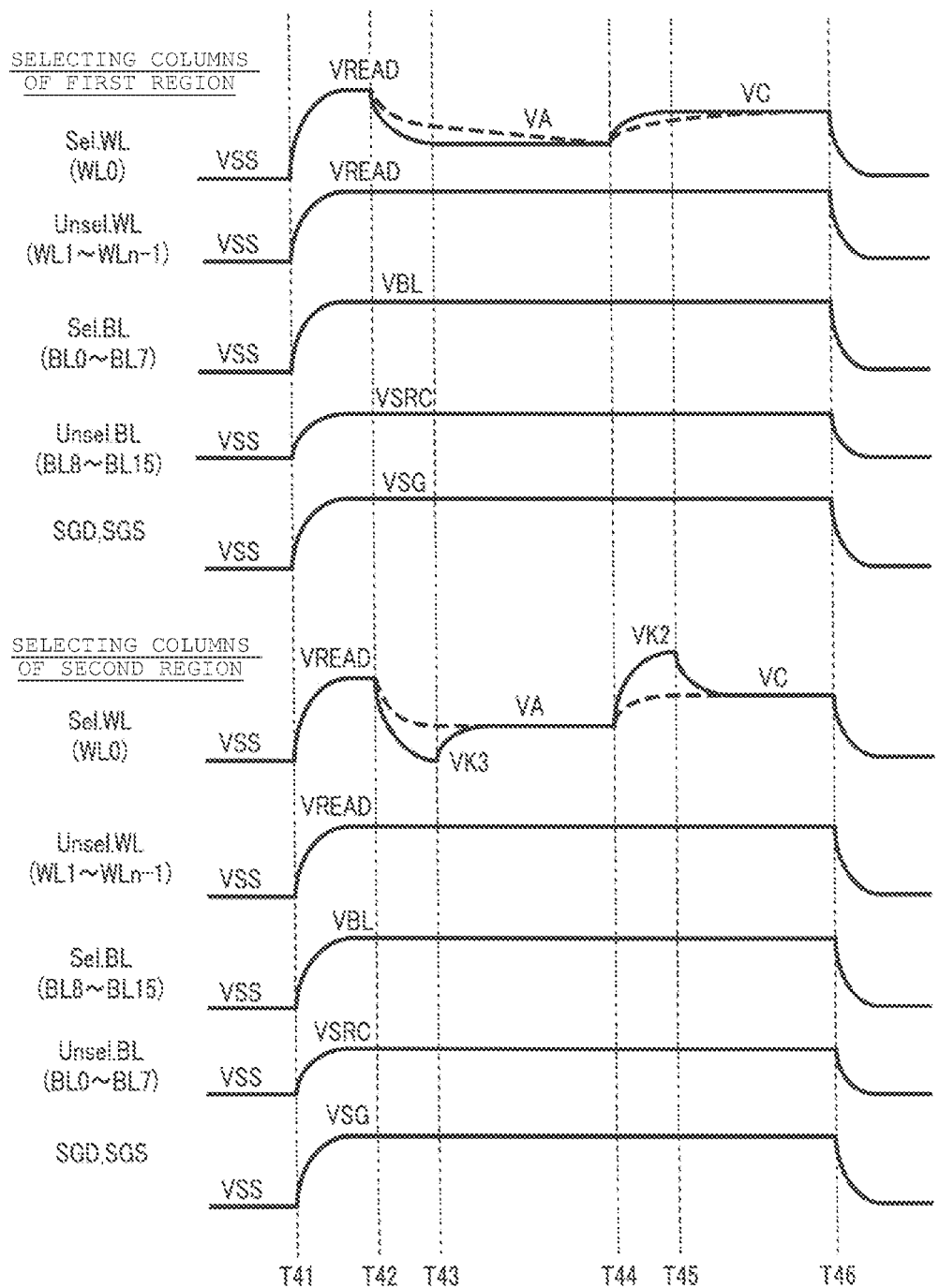
FIG. 16 is a timing chart illustrating various voltages of a read operation in a semiconductor storage device according to a third embodiment.

FIG. 16 is a timing chart illustrating various voltages at the time of selecting columns of the first region and the time of selecting columns of the second region in a read operation.

As illustrated in FIG. 16, the memory cell array 11A is conceptually divided into two regions in column units and the read operation is performed in each region. At this time, a refresh operation is performed at the beginning of the read operation. The refresh operation is an operation for removing charges remaining inside the conductors 24 at the start of various operations in a 3-dimensional stacked NAND flash memory. Voltages to be supplied to the selected word lines WL are controlled according to the selection of the columns of the first region and the selection of the columns of the second region.

First, the timing chart in the case of selection of the columns (the bit lines BL0 to BL7) of the first region in the read operation will be described with reference to FIG. 16. FIG. 16 illustrates an example in which reading in accordance with the voltage VA and reading in accordance with the voltage VC are successively performed after the refresh operation has been performed.

As illustrated in FIG. 16, the various voltages are voltage VSS in an initial state (before time T41).

Then, at time T41, the CG drivers 42_1 to 42_$n$−1 supply the voltage VREAD to non-selected word lines WL1 to WLn−1. Accordingly, the memory cell transistors MT1 to MTn−1 connected to the non-selected word lines WL1 to WLn−1 are turned on regardless of threshold.

Subsequently, at time T41, the CG driver 42_0 also supplies the voltage VREAD to the non-selected word line WL0. Thus, the memory cell transistor MT0 connected to the non-selected word line WL0 is turned on regardless of its threshold.

At time T41, the SGS driver 41 supplies the voltage VSG to the select gate line SGS and the SGD driver 43 supplies the voltage VSG to the select gate line SGD. Thus, the selection transistors ST1 and ST2 are turned on.

At time 141, the voltage VBL is applied to the selected bit lines BL0 to BL7 and the voltage VSRC is applied to the non-selected bit lines BL8 to BL15.

Thus, the refresh operation is performed. That is, a refresh current flows to all the memory strings 36 and charges remaining in the conductors 24 (channels) are removed.

Next, at time T42, the CG driver 42_0 supplies the voltage VA to the selected word line WL0. Thus, the voltage VA is applied to the first portion of the selected word line WL0. Thus, reading is performed in accordance with the voltage VA of the memory cell transistor MT0 connected to the selected word line WL0 and connected to the selected bit lines BL0 to BL7 (located in the first region).

At this time, a voltage greater than the voltage VA is, in effect, applied to the second portion of the selected word line WL0. In other words, the second portion of the selected word line WL0 does not reach the voltage VA necessary for the reading due to long-distance delay. However, since the columns of the second region in which the second portion of the selected word line WL0 is located are non-selected, a problem does not occur in the read operation in this example.

Subsequently, at time 144, the CG driver 42_0 supplies the voltage VC to the selected word line WL0. Thus, the voltage VC is applied to the first portion of the selected word line WL0. Then, reading is performed in accordance with the voltage VC of the memory cell transistor MT0 connected to the selected word line WL0 and connected to the selected bit lines BL0 to BL7 (located in the first region).

At this time, a voltage less than the voltage VC is, in effect, applied to the second portion of the selected word line WL0. In other words, the second portion of the selected word line WL0 does not reach the voltage VC necessary for the reading (does not boost to the voltage VC) due to long-distance delay. However, as was the case at the time of the reading in accordance with the voltage VA, a problem does not occur in the read operation in this example.

Thereafter, at time T46, the various voltages are returned to voltage VSS. Thus, each transistor is turned off and the read operation ends.

Next, a timing chart in the case of selection of the columns (the bit lines BL8 to BL15) of the second region in the read operation will be described with reference to FIG. 16.

As illustrated in FIG. 16, various voltages are voltages VSS in an initial state (before time T41).

At time T41 to time T42, the refresh operation is performed as was also the case of selection of the columns of the first region.

Subsequently, at time T42, the CG driver 42_0 supplies a voltage VK3 to the selected word line WL0. Thus, the voltage VK3 is applied to the first portion of the selected word line WL0. The voltage VK3 is a lower voltage temporarily supplied by the CG driver 42_0 and a relation of VK3<VA is satisfied. In accordance with the voltage VK3, the voltage VA is applied to the second portion of the selected word line WL0 without delay (faster than when VA is supplied).

Thereafter, at time T43, the CG driver 42_0 supplies the voltage VA to the selected word line WL0. Thus, the voltage VA is applied to the first portion of the selected word line WL0. Then, reading is performed in accordance with the voltage VA of the memory cell transistor MT0 connected to the selected word line WL0 and connected to the selected bit lines BL8 to BL15 (located in the second region).

At this time, the voltage VA is applied to the first portion of the selected word line WL0 after the voltage VK3 is applied. Therefore, in the first portion of the selected word line WL0, it takes some time until stabilization at the voltage VA necessary for the reading occurs. However, since the columns of the first region in which the first portion of the selected word line WL0 is located are non-selected, a problem does not occur in the read operation in this example.

Subsequently, at time T44, the CG driver 42_0 supplies the voltage VK2 to the selected word line WL0. Thus, the voltage VK2 is applied to the first portion of the selected word line WL0. In accordance with the voltage VK2, the voltage VC is applied to the second portion of the selected word line WL0 without delay (that is, faster than when only VC is supplied to the first portion).

Thereafter, at time T45, the CG driver 42_0 supplies the voltage VC to the selected word line WL0. Thus, the voltage VC is applied to the first portion of the selected word line WL0. Then, reading is performed in accordance with the voltage VC of the memory cell transistor MT0 connected to the selected word line WL0 and connected to the selected bit lines BL8 to BL15 (located in the second region).

At this time, the voltage VC is applied to the first portion of the selected word line WL0 after the voltage VK2 has been applied. Therefore, in the first portion of the selected word line WL0, it takes some time until stabilization at the voltage VC necessary for the reading occurs. However, as was the case at the time of reading in accordance with the voltage VA, a problem does not occur in the read operation in this example.

Thereafter, at time T46, the various voltages are returned to voltage VSS. Thus, each transistor is turned off and the read operation ends.

Advantages of Third Embodiment

In the third embodiment, the refresh operation is performed at the starting of the read operation. During the time of discharging of the selected word lines WL after the refresh operation, the voltages to be supplied to the selected word lines WL are appropriately controlled in for the selection of the columns of the first region or the selection of the columns of the second region. Thus, even when the refresh operation is performed, the read voltages can still be applied rapidly to the first or second portion of the selected word lines WL, and thus it is possible to achieve a shortening of a read time.

Fourth Embodiment

A semiconductor storage device according to a fourth embodiment will be described with reference to FIG. 17. The fourth embodiment is a modification example of the third embodiment. Reading in accordance with the voltage VC and reading in accordance with the voltage VA are performed in sequence after the refresh operation. That is, the order of the reading (voltage C level first, then voltage A level second) is in reverse in this fourth embodiment as compared to the third embodiment (voltage A level first, then voltage C level second).

In the fourth embodiment, differences from the third embodiment will be mainly described and similarities will not be described.

Read Operation of Fourth Embodiment

Hereinafter, a read operation according to the fourth embodiment will be described with reference to FIG. 17.

First, a timing chart in the case of selection of the columns (the bit lines BL0 to BL7) of the first region in the read operation will be described with reference to FIG. 17. FIG. 17 illustrates an example in which the reading in accordance with the voltage VC and the reading in accordance with the voltage VA are sequentially performed in order after the refresh operation is performed.

Figure 17:
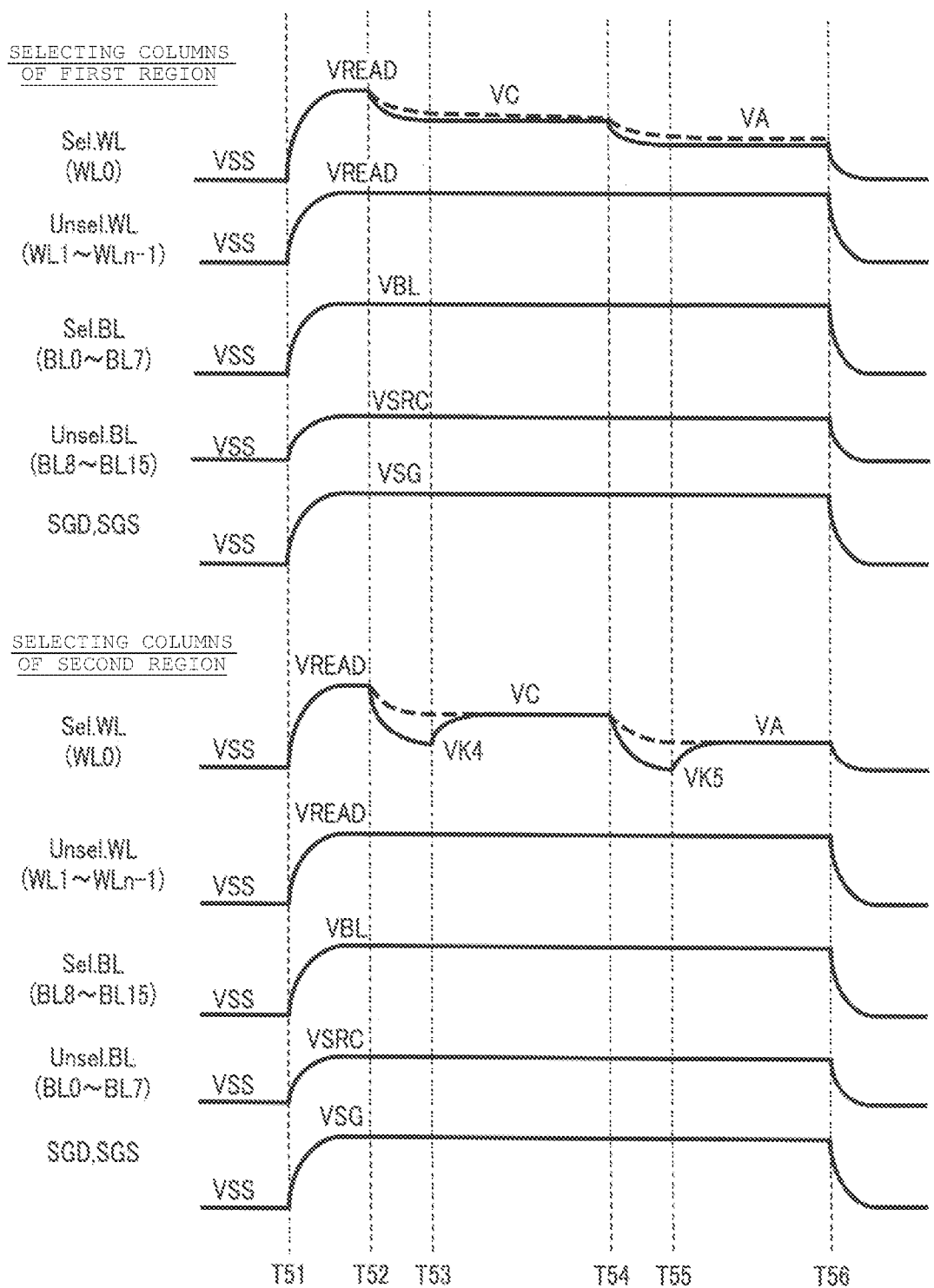
FIG. 17 is a timing chart illustrating various voltages of a read operation in a semiconductor storage device according to a fourth embodiment.

As illustrated in FIG. 17, at time T51 and time T52, the refresh operation is performed as in the third embodiment.

Subsequently, at time T52, the CG driver 42_0 supplies the voltage VC to the selected word line WL0. Thus, the voltage VC is applied to the first portion of the selected word line WL0. Thus, reading is performed in accordance with the voltage VC of the memory cell transistor MT0 connected to the selected word line WL0 and connected to the selected bit lines BL0 to BL7 (located in the first region).

At this time, a voltage greater than the voltage VC is being applied to the second portion of the selected word line WL0. In other words, the second portion of the selected word line WL0 does not reach the voltage VC necessary for the reading due to long-distance delay. However, since the columns of the second region in which the second portion of the selected word line WL0 is located are non-selected, a problem does not occur in the read operation in this example.

Subsequently, at time 154, the CG driver 42_0 supplies the voltage VA to the selected word line WL0. Thus, the voltage VA is applied to the first portion of the selected word line WL0. Then, reading is performed in accordance with the voltage VA of the memory cell transistor MT0 connected to the selected word line WL0 and connected to the selected bit lines BL0 to BL7 (located in the first region).

At this time, a voltage greater than the voltage VA is being applied to the second portion of the selected word line WL0. In other words, the second portion of the selected word line WL0 does not reach the voltage VA necessary for the reading due to long-distance delay. However, as at the time of the reading in accordance with the voltage VC, a problem does not occur in the read operation in this example.

Thereafter, at time T56, the various voltages are returned to voltage VSS. Thus, each transistor is turned off and the read operation ends.

Next, a timing chart in the case of selection of the columns (the bit lines BL8 to BL15) of the second region in the read operation will be described with reference to FIG. 17.

As illustrated in FIG. 17, at time T51 to time T52, the refresh operation is performed as in the case of selection of the columns of the first region.

Subsequently, at time T52, the CG driver 42_0 supplies a voltage VK4 to the selected word line WL0. Thus, the voltage VK4 (where VK4<VC) is applied to the first portion of the selected word line WL0. In accordance with the voltage VK4, the voltage VC is, in effect, applied to the second portion of the selected word line WL0 without delay (faster than when VC is supplied).

Thereafter, at time T53, the CG driver 42_0 supplies the voltage VC to the selected word line WL0. Thus, the voltage VC is applied to the first portion of the selected word line WL0. Then, reading is performed in accordance with the voltage VC of the memory cell transistor MT0 connected to the selected word line WL0 and connected to the selected bit lines BL8 to BL15 (located in the second region).

At this time, the voltage VC is applied to the first portion of the selected word line WL0 after the voltage VK4 has been applied. Therefore, it takes some time until stabilization at the voltage VC necessary for the reading occurs in in the first portion of the selected word line WL0. However, since the columns of the first region in which the first portion of the selected word line WL0 is located are non-selected, a problem does not occur in the read operation in this example.

Subsequently, at time T54, the CG driver 42_0 supplies a voltage VK5 (where VK5<VA) to the selected word line WL0. Thus, the voltage VK5 is applied to the first portion of the selected word line WL0. In accordance with the voltage VK5, the voltage VA is applied to the second portion of the selected word line WL0 without delay (at least faster than when just voltage VA is supplied).

Thereafter, at time T55, the CG driver 42_0 supplies the voltage VA to the selected word line WL0. Thus, the voltage VA is applied to the first portion of the selected word line WL0. Then, reading is performed in accordance with the voltage VA of the memory cell transistor MT0 connected to the selected word line WL0 and connected to the selected bit lines BL8 to BL15 (located in the second region).

At this time, the voltage VA is applied to the first portion of the selected word line WL0 after the voltage VK5 is applied. Therefore, it takes some time until stabilization at the voltage VA necessary for the reading occurs in the first portion of the selected word line WL0. However, as at the time of reading in accordance with the voltage VC, a problem does not occur in the read operation in this example.

Thereafter, at time T56, various voltages are voltages VSS. Thus, each transistor is turned off and the read operation ends.

Advantages of Fourth Embodiment

In the fourth embodiment, the reading in accordance with the voltage VC and the reading in accordance with the voltage VA are performed in sequence after the refresh operation has been performed. That is, the order of read voltages goes in the direction of decreasing voltage level and the reading is performed in this order. At the time of discharging of the selected word lines WL after the refresh operation and the time of discharging after the reading in accordance with the voltage VC, the voltages to be supplied to the selected word lines WL are appropriately controlled in the case of selection of the columns of the first region and the case of selection of the columns of the second region. Thus, even when the refresh operation is performed, and the read voltages are dropped and the reading is performed, the read voltages can be applied rapidly to the first or second portion of the selected word lines WL, and thus it is possible to achieve shortening of a read time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a first memory cell electrically connected to a first bit line and a first word line;
a second memory cell electrically connected to a second bit line and the first word line; and
a first circuit configured to supply voltages to the first word line, wherein
during a reading operation to read a page of memory cells including the first memory cell and the second memory cell, while the first memory cell is selected as a read target during a first time period, the first circuit supplies:
a first voltage to the first word line,
a second voltage less than the first voltage to the first word line after supplying the first voltage, and
a third voltage greater than the second voltage to the first word line after supplying the second voltage; and
during the reading operation to read the page of memory cells including the first memory cell and the second memory cell, while the second memory cell is selected as the read target during a second time period that is different from the first time period, the first circuit supplies:
the first voltage to the first word line,
a fourth voltage less than the second voltage to the first word line after supplying the first voltage,
the second voltage to the first word line after supplying the fourth voltage, and
a fifth voltage greater than the third voltage to the first word line after supplying the second voltage.

2. The semiconductor storage device according to claim 1, wherein a distance from the first circuit to the first memory cell is shorter than a distance from the first circuit to the second memory cell.

3. The semiconductor storage device according to claim 1, wherein during the reading operation to read the page of the memory cells, while the second memory cell is selected as the read target during the second time period, the first circuit supplies the second voltage to the first word line directly after supplying the fourth voltage.

4. The semiconductor storage device according to claim 3, wherein during the reading operation to read the page of the memory cells, while the second memory cell is selected as the read target during the second time period, the first circuit supplies the third voltage to the first word line directly after supplying the fifth voltage.

5. The semiconductor storage device according to claim 4, wherein
during the reading operation to read the page of the memory cells, while the first memory cell is selected as the read target during the first time period, the first circuit supplies:
the second voltage to the first word line directly after supplying the first voltage, and
the third voltage to the first word line directly after supplying the second voltage; and
during the reading operation to read the page of the memory cells, while the second memory cell is selected as the read target during the second time period, the first circuit supplies:
the fourth voltage to the first word line directly after supplying the first voltage, and
the fifth voltage to the first word line directly after supplying the second voltage.

6. The semiconductor storage device according to claim 1, further comprising:
a third memory cell electrically connected to a third bit line and the first word line, the third bit line being between the first bit line and the second bit line; and
a fourth memory cell electrically connected to a fourth bit line and the first word line, the second bit line being between the third bit line and the fourth bit line, wherein during the reading operation to read the page of the memory cells, while the first memory cell is selected as the read target during the first time period, the first circuit supplies:
a sixth voltage to the first bit line, and
a seventh voltage to the third bit line, the second bit line and the fourth bit line; and
during the reading operation to read the page of the memory cells, while the second memory cell is selected as the read target during the second time period, the first circuit supplies:
the sixth voltage to the second bit line, and
the seventh voltage to the first bit line, the third bit line and the fourth bit line.

7. The semiconductor storage device according to claim 1, wherein the first and second bit lines are adjacent.

8. The semiconductor storage device according to claim 1, wherein the first memory cell is between the first circuit and the second memory cell along the first word line.

9. A semiconductor storage device, comprising:
a first memory cell electrically connected to a first bit line and a first word line;
a second memory cell electrically connected to a second bit line and the first word line; and
a first circuit configured to supply voltages to the first word line, wherein
during a reading operation to read a page of memory cells including the first memory cell and the second memory cell, while the first memory cell is selected as a read target during a first time period, the first circuit supplies:
a first voltage to the first word line, a second voltage less than the first voltage to the first word line after supplying the first voltage, and a third voltage less than the second voltage to the first word line directly after supplying the second voltage; and during the reading operation to read the page of memory cells including the first memory cell and the second memory cell, while the second memory cell is selected as the read target during a second time period that is different from the first time period, the first circuit supplies:

the first voltage to the first word line, a fourth voltage less than the second voltage to the first word line directly after supplying the first voltage, the second voltage to the first word line directly after supplying the fourth voltage, and a fifth voltage less than the third voltage to the first word line directly after supplying the second voltage.

10. The semiconductor storage device according to claim 9, wherein a distance from the first circuit to the first memory cell is shorter than a distance from the first circuit to the second memory cell.

11. The semiconductor storage device according to claim 9, wherein during the reading operation to read the page of the memory cells, while the second memory cell is selected as the read target during the second time period, the first circuit supplies the second voltage to the first word line directly after supplying the fourth voltage.

12. The semiconductor storage device according to claim 11, wherein during the reading operation to read the page of the memory cells, while the second memory cell is selected as the read target during the second time period, the first circuit supplies the third voltage to the first word line directly after supplying the fifth voltage.

13. The semiconductor storage device according to claim 12, wherein during the reading operation to read the page of the memory cells, while the first memory cell is selected as the read target during the first time period, the first circuit supplies:

the second voltage to the first word line directly after supplying the first voltage, and the third voltage to the first word line directly after supplying the second voltage; and during the reading operation to read the page of the memory cells, while the second memory cell is selected as the read target during the second time period, the first circuit supplies:

the fourth voltage to the first word line directly after supplying the first voltage, and the fifth voltage to the first word line directly after supplying the second voltage.

14. The semiconductor storage device according to claim 9, further comprising:

a third memory cell electrically connected to a third bit line and the first word line, the third bit line being between the first bit line and the second bit line; and a fourth memory cell electrically connected to a fourth bit line and the first word line, the second bit line being between the third bit line and the fourth bit line, wherein during the reading operation to read the page of the memory cells, while the first memory cell is selected as the read target during the first time period, the first circuit supplies:

a sixth voltage to the first bit line, and a seventh voltage to the third bit line, the second bit line and the fourth bit line, and during the reading operation to read the page of the memory cells, while the second memory cell is selected as the read target during the second time period, the first circuit supplies:

the sixth voltage to the second bit line, and the seventh voltage to the first bit line, the third bit line and the fourth bit line.

15. The semiconductor storage device according to claim 9, wherein the first and second bit lines are adjacent.

16. The semiconductor storage device according to claim 9, wherein the first memory cell is between the first circuit and the second memory cell along the first word line.

* * * * *